(12) United States Patent
Choi

(10) Patent No.: US 10,249,634 B2
(45) Date of Patent: Apr. 2, 2019

(54) SEMICONDUCTOR DEVICE AND METHOD OF MANUFACTURING THE SAME

(71) Applicant: SK hynix Inc., Icheon-si, Gyeonggi-do (KR)

(72) Inventor: Kang Sik Choi, Seongnam-Si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/714,430

(22) Filed: Sep. 25, 2017

(65) Prior Publication Data

US 2018/0247949 A1 Aug. 30, 2018

(30) Foreign Application Priority Data

Feb. 27, 2017 (KR) ........................ 10-2017-0025707

(51) Int. Cl.
*H01L 27/11556* (2017.01)
*H01L 27/11582* (2017.01)
*H01L 29/06* (2006.01)
*H01L 27/11565* (2017.01)
*H01L 29/08* (2006.01)
*H01L 27/11519* (2017.01)

(52) U.S. Cl.
CPC .. *H01L 27/11556* (2013.01); *H01L 27/11519* (2013.01); *H01L 27/11565* (2013.01); *H01L 27/11582* (2013.01); *H01L 29/0649* (2013.01); *H01L 29/0847* (2013.01)

(58) Field of Classification Search
None
See application file for complete search history.

(56) References Cited

U.S. PATENT DOCUMENTS

2014/0219016 A1* 8/2014 Li .......................... G11C 17/16
365/182
2014/0264549 A1* 9/2014 Lee .................... H01L 27/11582
257/324

FOREIGN PATENT DOCUMENTS

| KR | 1020120041314 A | 5/2012 |
| KR | 1020140112827 A | 9/2014 |
| KR | 1020160135935 A | 11/2016 |

\* cited by examiner

*Primary Examiner* — Alexander G Ghyka
(74) *Attorney, Agent, or Firm* — William Park & Associates Ltd.

(57) ABSTRACT

Provided herein may be a semiconductor device. The semiconductor device may include a stack. The semiconductor device may include channel layers including channel patterns passing through the stack, dummy channel patterns passing through the stack, and a coupling pattern which may be disposed below the stack and couples the channel patterns with the dummy channel patterns. The semiconductor device may include a bit line which is disposed on the stack and coupled with the channel patterns. The semiconductor device may include a well pick-up line which is disposed on the stack and coupled with the dummy channel patterns.

16 Claims, 30 Drawing Sheets

FIG. 3A
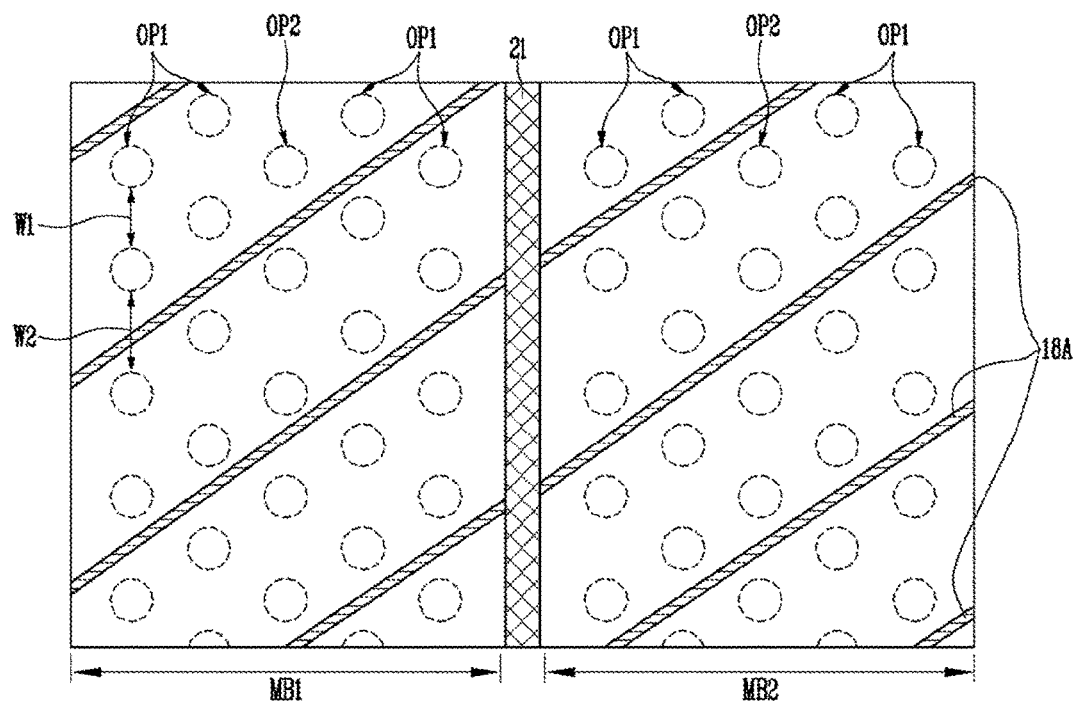
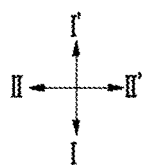

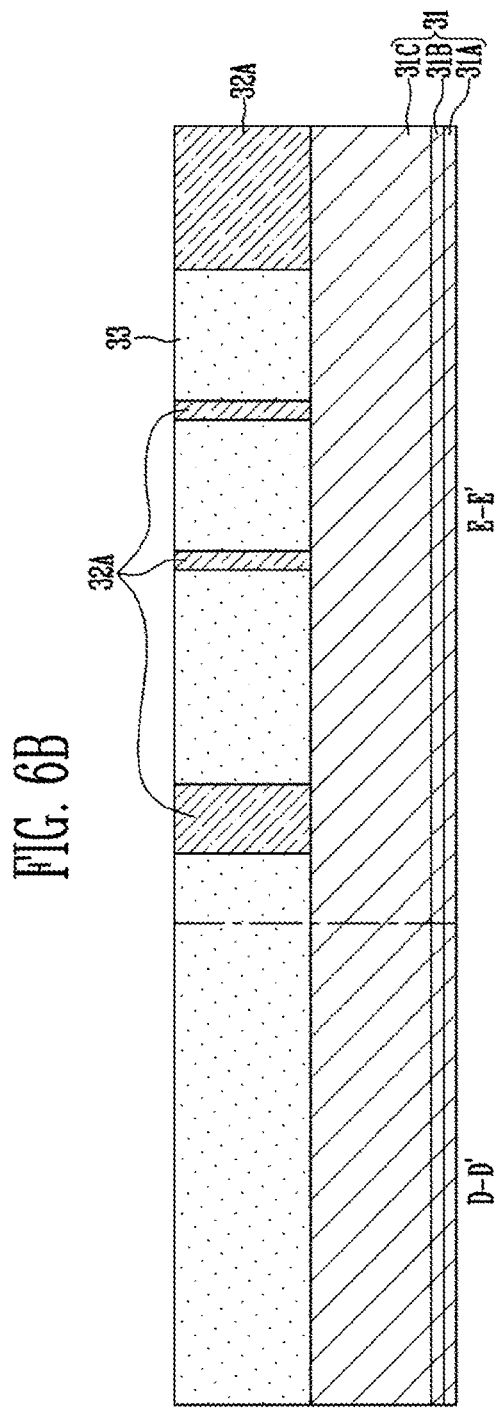

FIG. 7A
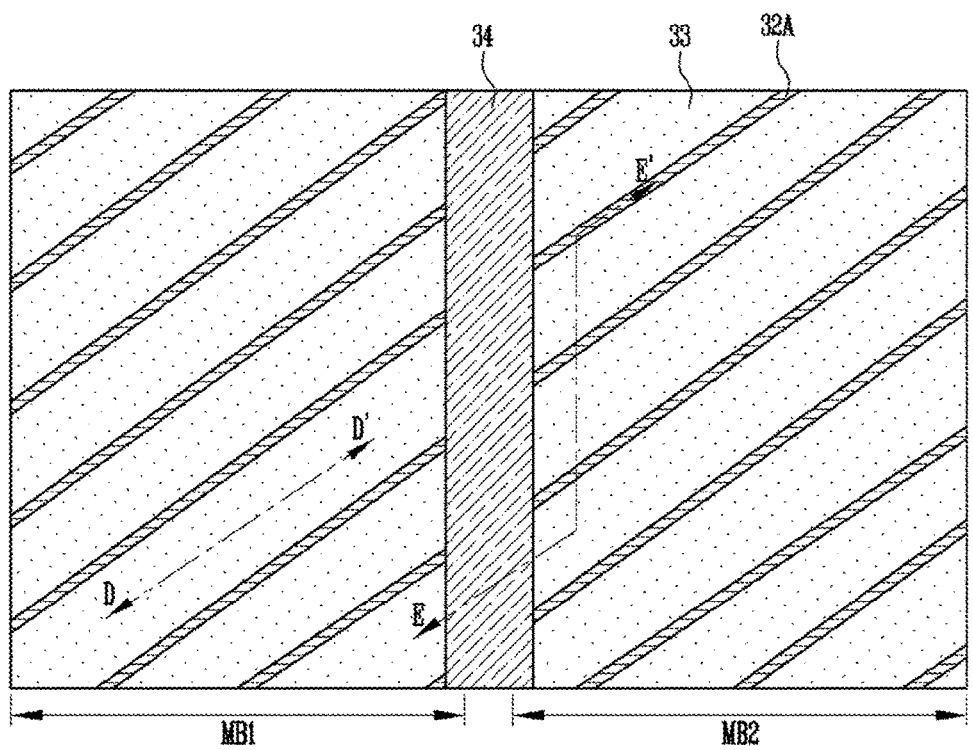
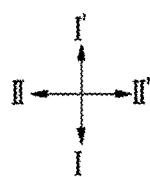

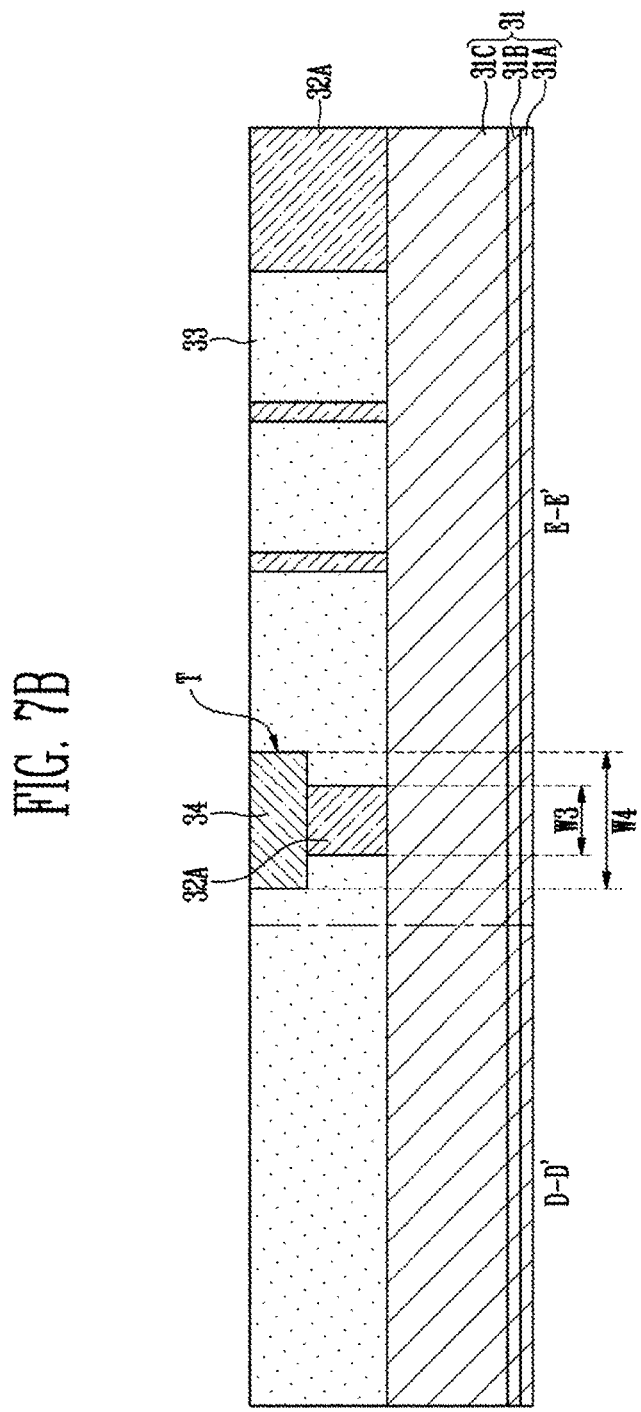

FIG. 8A
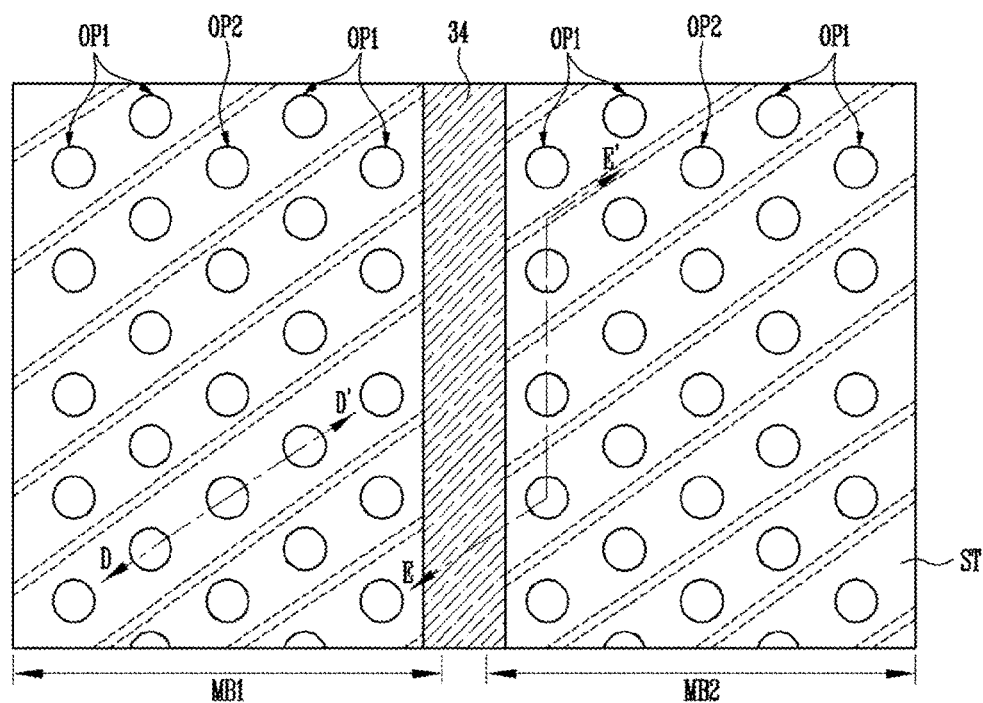
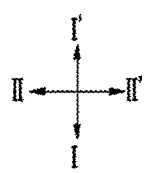

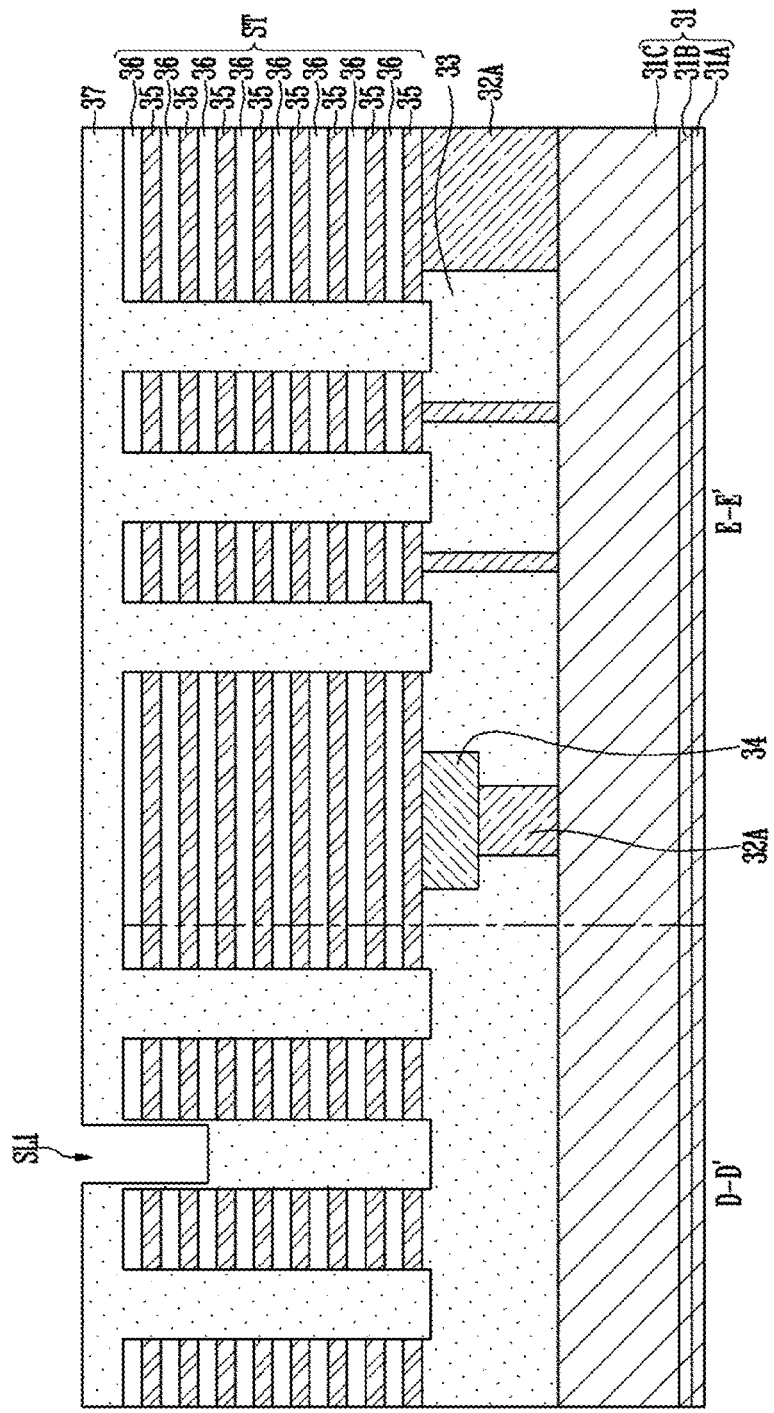

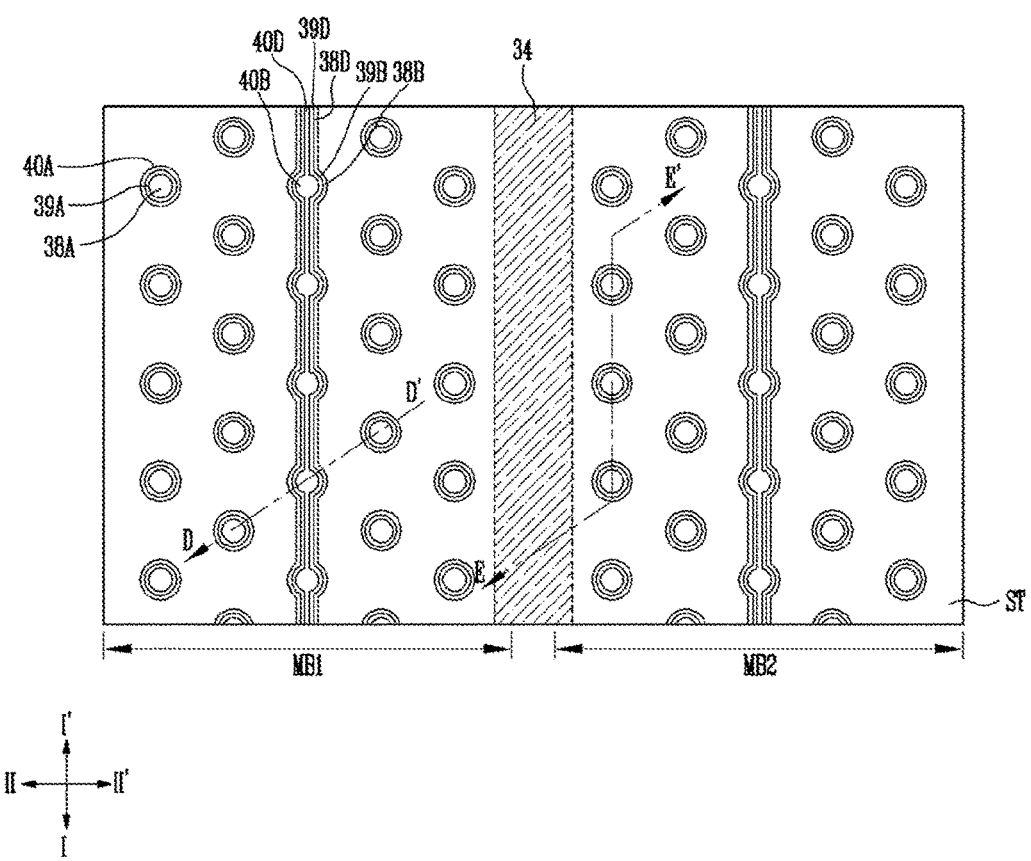

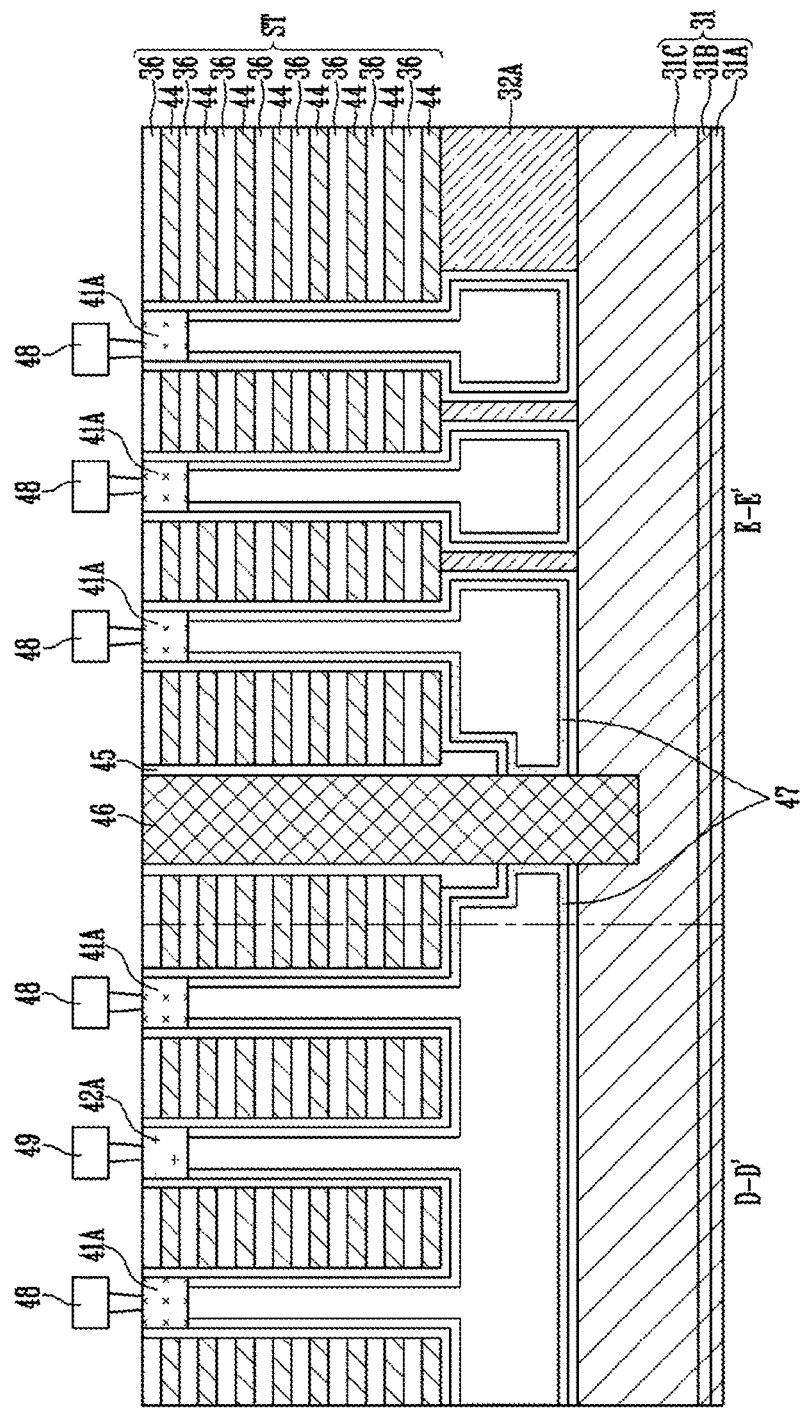

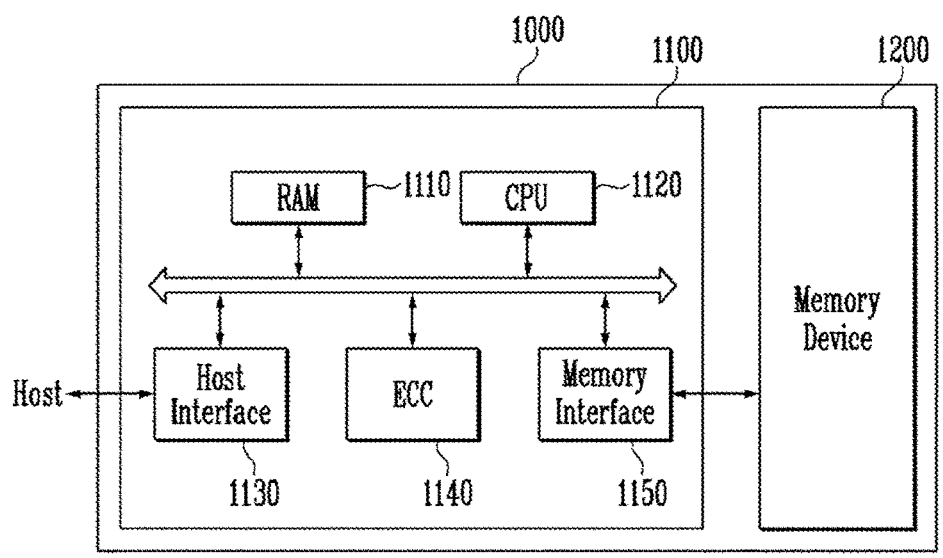
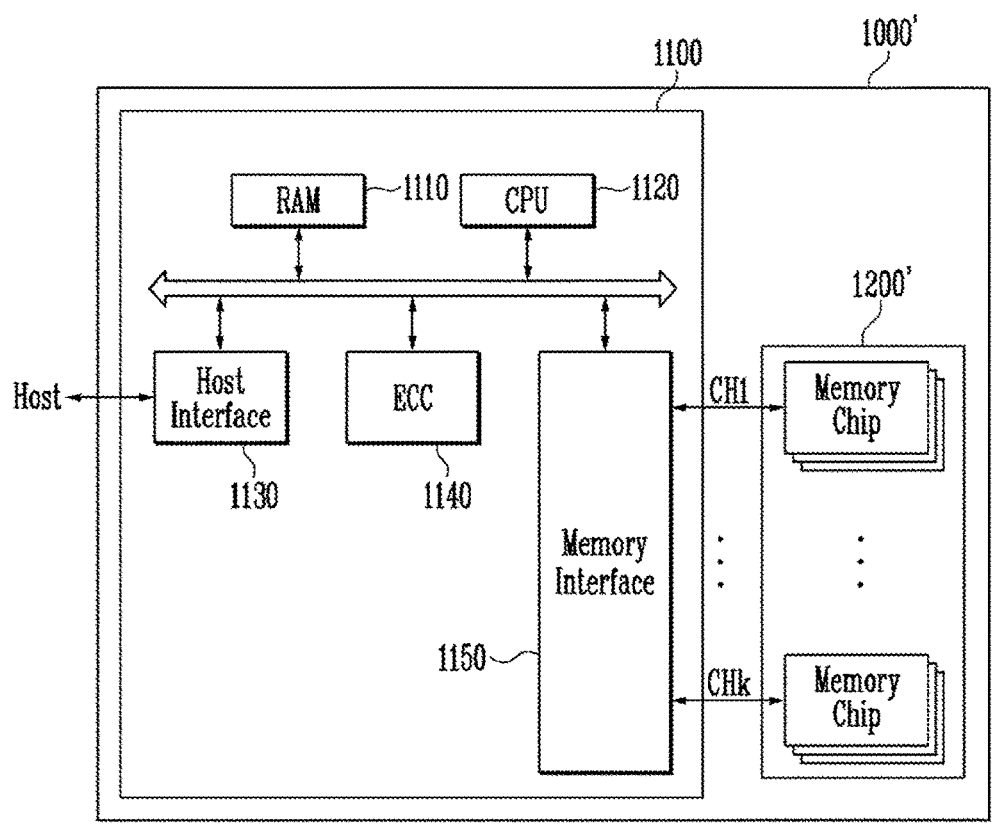

SEMICONDUCTOR DEVICE AND METHOD OF MANUFACTURING THE SAME

CROSS-REFERENCE TO RELATED APPLICATION

The present application claims priority under 35 U.S.C. § 119(a) to Korean patent application number 10-2017-0025707 filed on Feb. 27, 2017 in the Korean Intellectual Property Office, the entire disclosure of which is incorporated herein by reference.

BACKGROUND

1. Technical Field

Various embodiments of the present disclosure may generally relate to an electronic device, and more particularly, to a semiconductor device and a method of manufacturing the same.

2. Related Art

Non-volatile memory devices retain stored data regardless of power on/off conditions. Recently, because the improvement in integration of a two-dimensional non-volatile memory device including memory cells formed on a substrate in a single layer is limited, a three-dimensional (3D) non-volatile memory device including memory cells stacked in a vertical direction on a substrate has been proposed.

A three-dimensional non-volatile memory device may include interlayer insulating layers and gate electrodes that are stacked alternately with each other, and channel layers passing therethrough, with memory cells stacked along the channel layers. To improve the operational reliability of such a non-volatile memory device having a three-dimensional structure, various structures and manufacturing methods have been developed.

SUMMARY

An embodiment of the present disclosure may provide for a semiconductor device. The semiconductor device may include a stack. The semiconductor device may include channel layers each including channel patterns passing through the stack. The semiconductor device may include dummy channel patterns passing through the stack. The semiconductor device may include a coupling pattern disposed below the stack and coupling the channel patterns with the dummy channel patterns. The semiconductor device may include a bit line coupled with the channel patterns. The semiconductor device may include a well pick-up line coupled with the dummy channel patterns.

An embodiment of the present disclosure may provide for a semiconductor device. The semiconductor device may include a stack. The semiconductor device may include a channel layer including channel patterns passing through the stack. The semiconductor device may include dummy channel patterns passing through the stack. The semiconductor device may include a coupling pattern coupling the channel patterns with the dummy channel patterns. The semiconductor device may include first pads coupled with the respective channel patterns. Each of the first pads may include a first-type impurity. The semiconductor device may include second pads coupled with the respective dummy channel patterns. Each of the second pads may include a second-type impurity different from the first-type impurity.

An embodiment of the present disclosure may provide for a method of manufacturing a semiconductor device. The method may include forming a first sacrificial layer on a source layer. The method may include forming a stack on the first sacrificial layer. The method may include forming first and second openings passing through the stack. The method may include forming a third opening by removing the first sacrificial layer through the first and second openings. The method may include forming a channel layer, including a coupling pattern disposed in the third opening, a channel pattern disposed in the first opening, and a dummy channel pattern disposed in the second opening. The method may include forming a well pick-up line coupled with the dummy channel pattern; and forming a bit line coupled with the channel pattern.

An embodiment of the present disclosure may provide for a method of manufacturing a semiconductor device. The method may include forming a first sacrificial layer on a source layer. The method may include forming a stack on the first sacrificial layer. The method may include forming first and second openings passing through the stack. The method may include forming a third opening by removing the first sacrificial layer through the first and second openings. The method may include forming a channel layer, including a coupling pattern disposed in the third opening, a channel pattern disposed in the first opening, and a dummy channel pattern disposed in the second opening. The method may include and forming first pads coupled with the channel patterns, each of the first pads may include a first-type impurity, and second pads coupled with the dummy channel patterns, each of the second pads may include a second-type impurity different from the first-type impurity.

An embodiment of the present disclosure may provide for a method of manufacturing a semiconductor device. The method may include forming a stack. The method may include forming channel layers each comprising channel patterns passing through the stack, dummy channel patterns passing through the stack, and a coupling pattern disposed below the stack and coupling the channel patterns with the dummy channel patterns. The method may include forming a bit line coupled with the channel patterns. The method may include forming a well pick-up line coupled with the dummy channel patterns.

BRIEF DESCRIPTION OF THE DRAWINGS

FIGS. 3A and 3B are layout diagrams illustrating the structure of the semiconductor device according to an embodiment of the present disclosure.

FIGS. 5 to 16 are views illustrating a method of manufacturing a semiconductor device according to an embodiment of the present disclosure.

FIGS. 17 and 18 are block diagrams illustrating the configuration of a memory system according to an embodiment of the present disclosure.

DETAILED DESCRIPTION

Figure 1A:
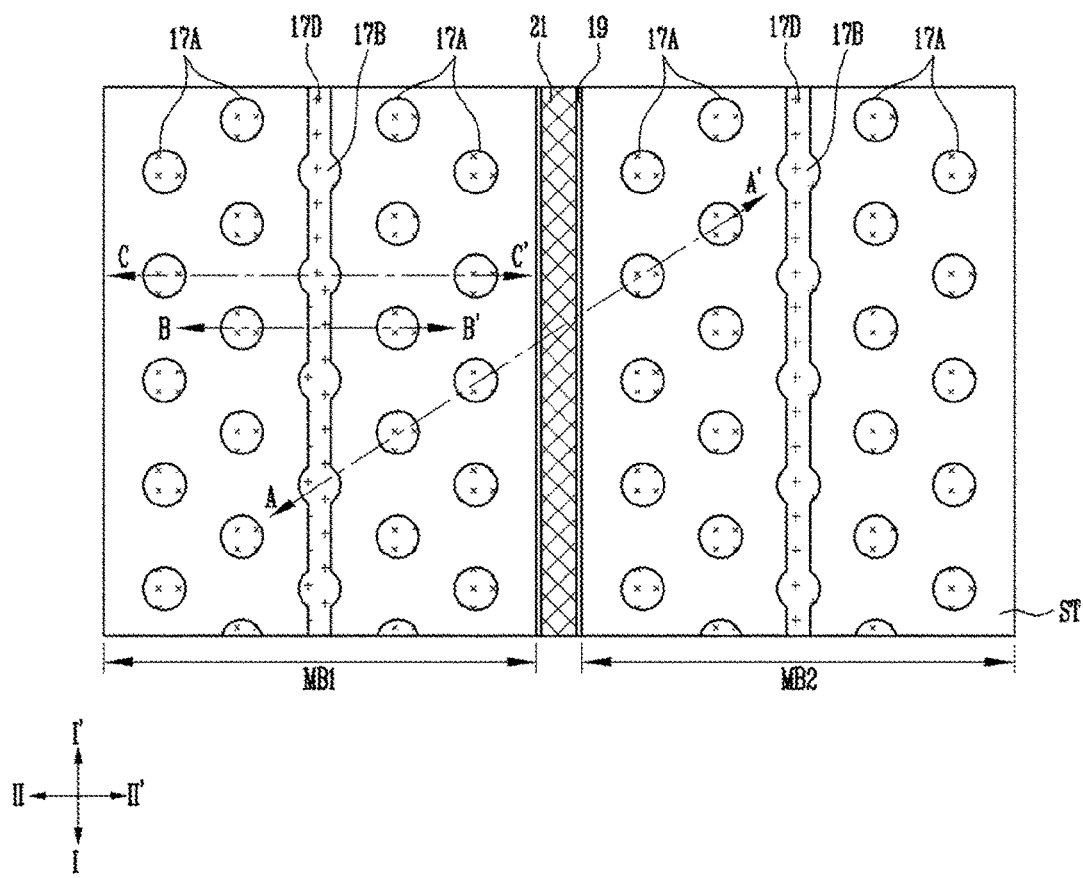
FIGS. 1A to 1C and 2A to 2C are views illustrating the structure of a semiconductor device according to an embodiment of the present disclosure.

Examples of embodiments will now be described hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the examples of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Various embodiments of the present disclosure may be directed to a semiconductor device which may be configured to facilitate the manufacturing process thereof and may have stable structure and improved characteristics, and a method of manufacturing the same.

Figure 1B:
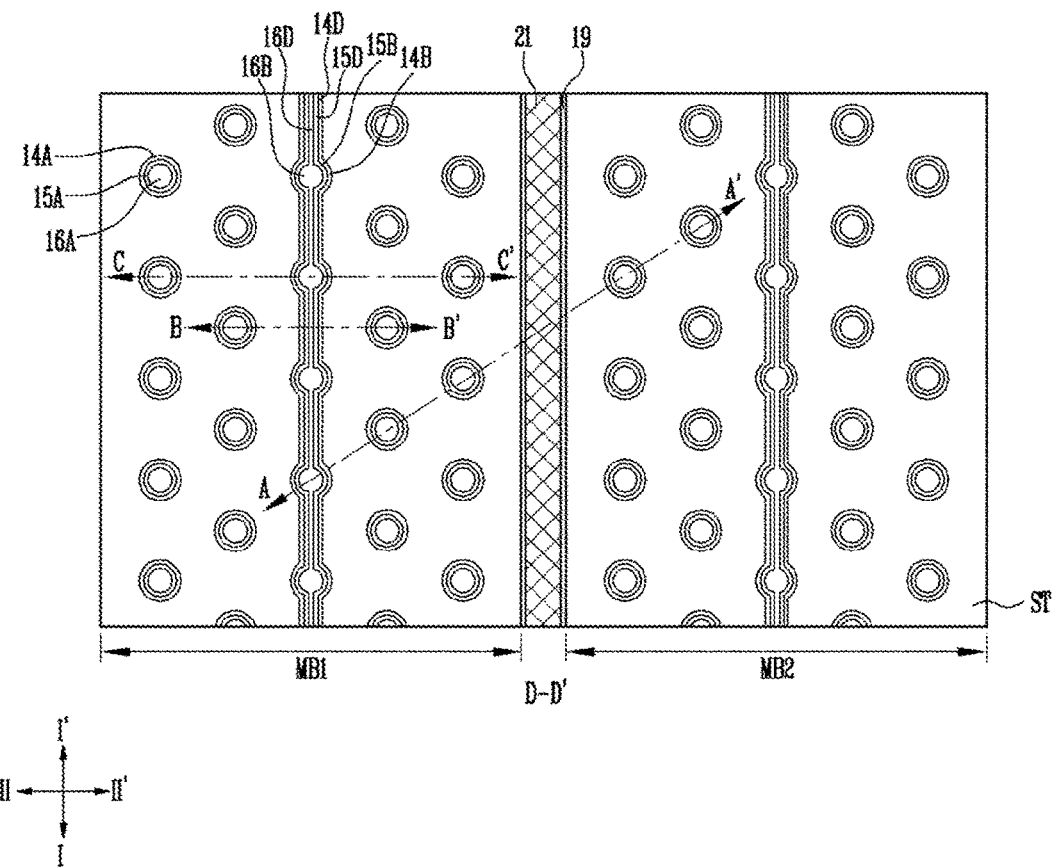
Figure 1C:
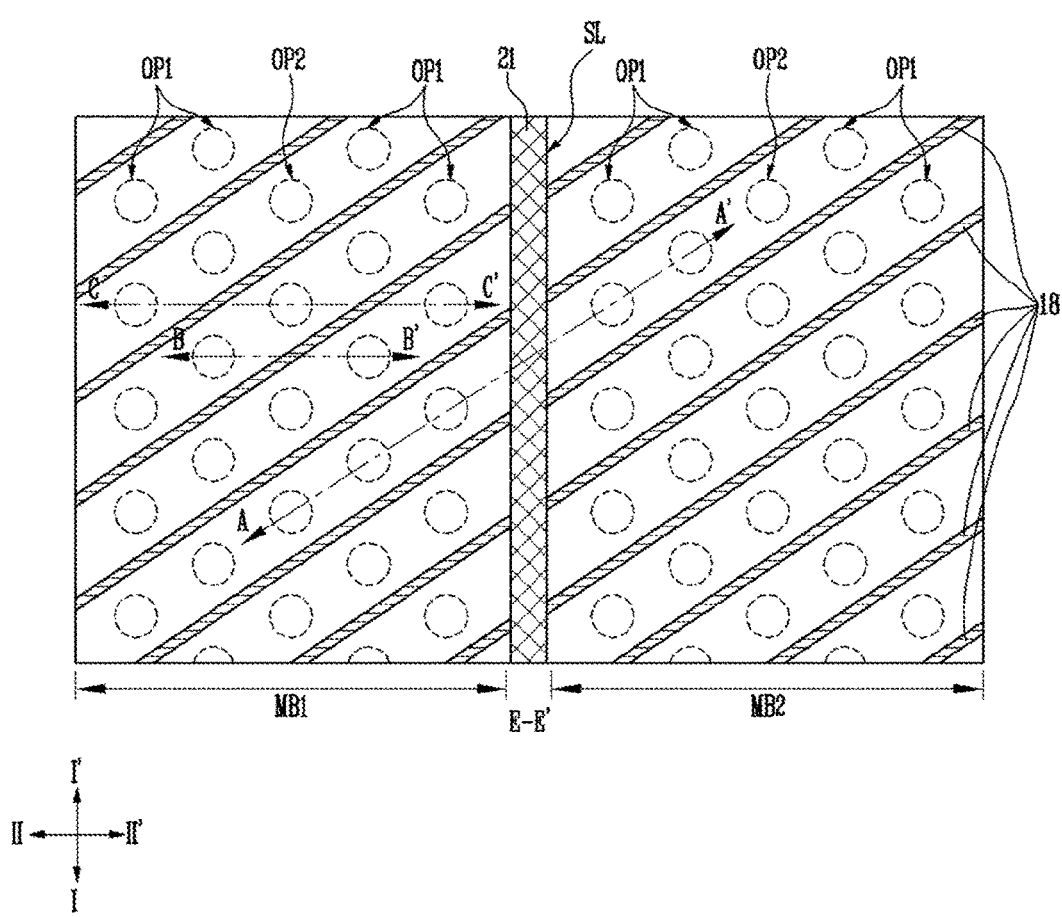
Figure 2A:
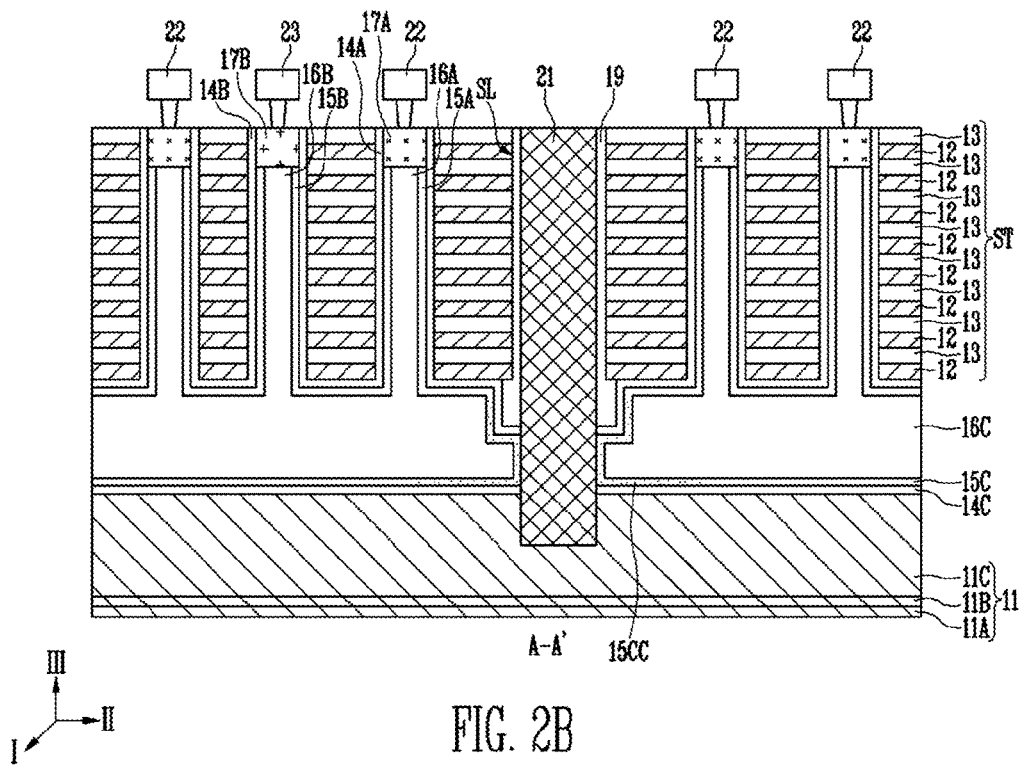
Figure 2B:
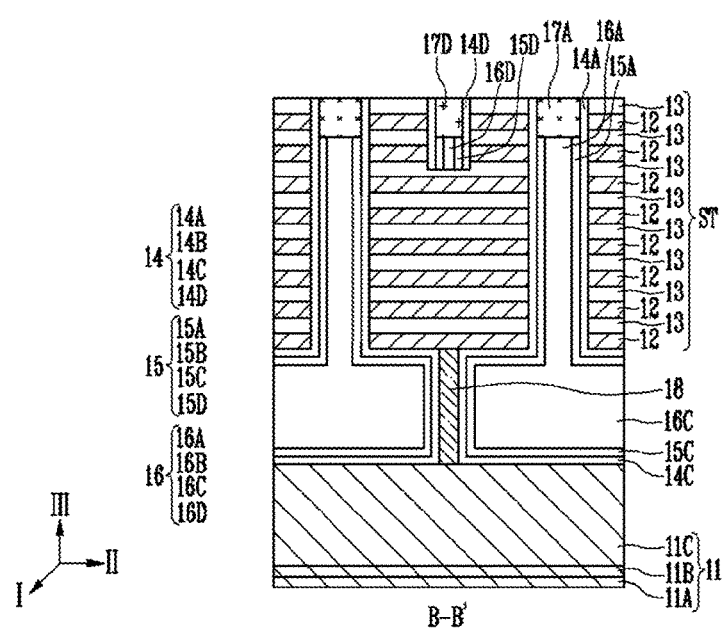
Figure 2C:
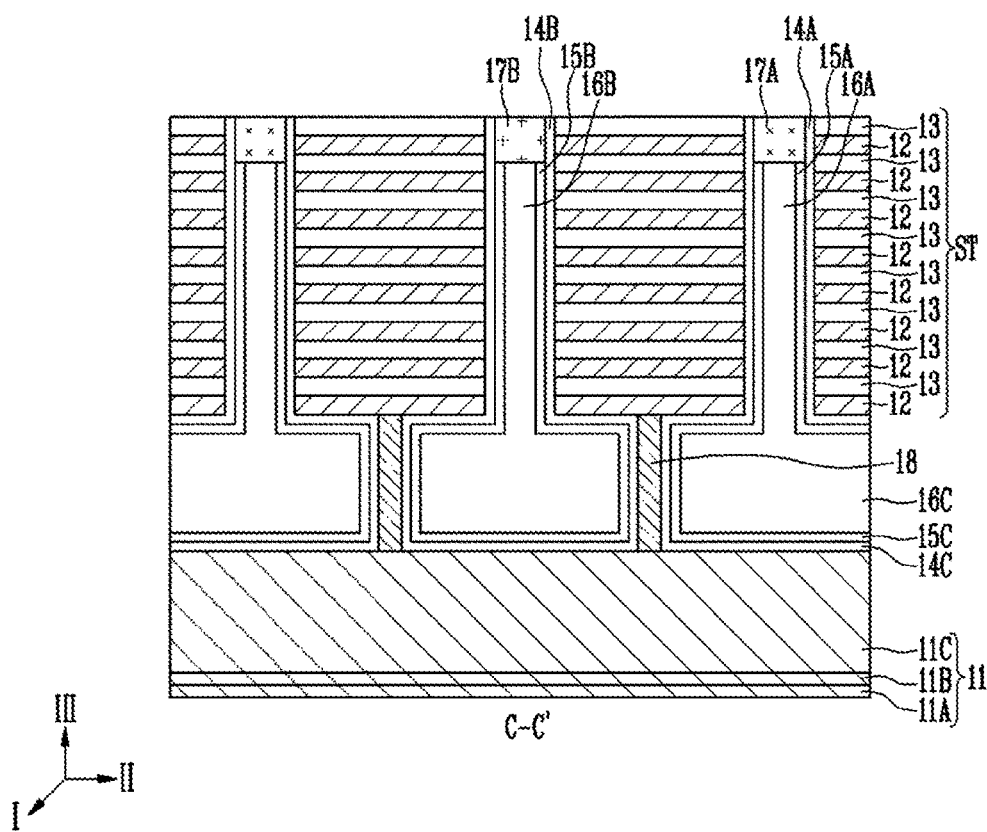

FIGS. 1A to 1C and 2A to 2C are views illustrating the structure of a semiconductor device according to an embodiment of the present disclosure. FIGS. 1A to 1C are layout diagrams. FIG. 2A is a sectional view taken along A-A' of FIGS. 1A to 1C. FIG. 2B is a sectional view taken along B-B' of FIGS. 1A to 1C. FIG. 2C is a sectional view taken along C-C' of FIGS. 1A to 1C.

Referring to FIGS. 1A to 1C and 2A to 2C, the semiconductor device according to an embodiment of the present disclosure includes a plurality of memory blocks MB1 and MB2. Memory strings are arranged in each of the memory blocks MB1 and MB2. Each memory block MB1, MB2 may be a unit in which data is erased during an erase operation.

The semiconductor device includes a stack ST, channel layers 15 (i.e., 15A, 15B, 15C, and 15D) passing through the stack ST, memory layers 14 (i.e., 14A, 14B, 14C, and 14D) enclosing the channel layers 15, bit lines 22, and a well pick-up line 23. Furthermore, the semiconductor device may further include a source layer 11 (i.e., 11A, 11B, and 11C), a support 18, a spacer 19. and a source pick-up line 21.

The stack ST includes conductive layers 12 and insulating layers 13 which are alternately stacked. Each conductive layer 12 may be a gate electrode such as a memory cell and a select transistor, and include metal such as tungsten. The insulating layers 13 may insulate the stacked conductive layers 12 from each other, and include an insulating material such as an oxide. For example, at least one uppermost conductive layer 12 may be a gate electrode of a drain select transistor, at least one lowermost conductive layer 12 may be a gate electrode of a source select transistor, and the other conductive layers 12 may be gate electrodes of the memory cells. In this case, at least one source select transistor, a plurality of memory cells and at least one drain select transistor may be coupled in series to configure a vertical memory string. In addition, each of at least one drain select transistor and the memory cells may have a gate all around structure in which a gate electrode encloses a sidewall of a channel layer, and the source select transistor may have a planar structure in which a gate electrode is formed on a channel layer.

Each of the channel layers 15 includes at least one or more channel patterns 15A and at least one or more dummy channel patterns 15B which pass through the stack ST, separate patterns 15D coupling the dummy channel patterns 15B to each other, and a coupling pattern 15C coupling the channel patterns 15A with the dummy channel patterns 15B. For instance, the channel patterns 15A are respectively disposed in first openings OP1 passing through the stack ST, and the dummy channel patterns 15B are respectively disposed in second openings OP2 passing through the stack ST. In addition, the coupling pattern 15C is disposed below the stack ST.

The channel patterns 15A and the dummy channel patterns 15B may be arranged in a first direction I-I' and in a second direction II-II' intersecting the first direction I-I'. For example, the channel patterns 15A and the dummy channel patterns 15B adjacent to each other in the second direction II-II' may be alternately arranged such that the centers thereof are offset from each other. Furthermore, the channel patterns 15A and the dummy channel patterns 15B may extend in a third direction III-III' intersecting the first and second directions I-I' and II-II'. The third direction III-III' may be a stacking direction of the stack ST. The channel patterns 15A and the dummy channel patterns 15B may penetrate the stack ST to a constant depth.

The dummy channel patterns 15B are coupled to each other by the separate patterns 15D. For instance, the separate patterns 15D are disposed between the dummy channel patterns 15B arranged in the first direction I-I'. The dummy channel patterns 15B and the separate patterns 15D that are alternately arranged are coupled to each other and extend in the first direction I-I'. The separate patterns 15D may penetrate the stack to a depth less than that of the dummy channel patterns 15B. For example, each of the separate patterns 15D may have a depth to which it penetrates at least one uppermost conductive layer 12 or penetrates the gate electrode of the drain select transistor of the corresponding memory string. Therefore, disposed on opposite sides of each separate pattern 15D, the corresponding conductive layers 12, e.g., gate electrodes of the corresponding drain select transistors adjacent to each other with respect to the second direction II-II', are electrically separated from each other by the separate pattern 15D.

Each of the channel patterns 15A and the dummy channel patterns 15B may have a solid structure, or a tubular structure in which a central region thereof is open. In the case where each channel pattern 15A has a tubular structure, the channel pattern 15A may be filled with a gap fill insulating pattern 16A. In the case where each dummy channel pattern 15B has a tubular structure, the dummy channel pattern 15B may be filled with a dummy gap fill insulating pattern 16B. Each of the channel patterns 15A and the dummy channel patterns 15B may have a cross-section such as a circle, an ellipse, a rectangle or a polygon.

Each separate pattern 15D may have a structure similar to or different from that of the dummy channel pattern 15B. For example, each separate pattern 15D may have a solid structure, or a tubular structure in which a central region thereof is open. In the case where each separate pattern 15D has a tubular structure, the separate pattern 15D may be filled with a dummy gap fill insluting pattern 16D. Each of the separate patterns 15D may have a width less than that of the dummy channel pattern 15B. Therefore, each dummy channel pattern 15B may include the dummy gap fill insulating pattern 16B. However, each separate pattern 15D may not include the dummy gap fill insulating pattern 16D.

The coupling pattern 15C couples the channel patterns 15A and the dummy channel patterns 15B which are adjacent to each other. In addition, the coupling pattern 15C makes contact with the source pick-up line 21. Therefore, the coupling pattern 15C electrically couples the source pick-up line 21 with the channel patterns 15A and provides a current path. The coupling pattern 15C may include a junction 15CC to reduce a resistance of a surface thereof coming into contact with the source pick-up line 21. For example, the junction 15CC may be a region doped with an N-type impurity.

The channel patterns 15A, the dummy channel patterns 15B, the coupling pattern 15C, and the separate patterns 15D may be formed through the same process and be made of the same material. For instance, each channel layer 15 may include the channel patterns 15A, the dummy channel patterns 15B, the coupling pattern 15C, and the separate patterns 15D. The channel patterns 15A, the dummy channel patterns 15B, the coupling pattern 15C, and the separate patterns 15D may be semiconductor patterns.

The gap fill insulating layer 16 may include a base part disposed below the stack ST, and first and second protrusions protruding from an upper surface of the base part. For instance, the gap fill insulating patterns 16A passing through the channel patterns 15A may be the first protrusions. The dummy gap fill insulating patterns 16B passing through the dummy channel patterns 15B may be the second protrusions. The dummy gap fill insulating pattern 16C formed in the coupling pattern 15C may be the base part.

The gap fill insulating patterns 16A and the dummy gap fill insulating patterns 16B to 16D may be formed through the same process. Each gap fill insulating layer 16 may include the gap fill insulating patterns 16A and the dummy gap fill insulating patterns 16B to 16D.

First pads 17A may be disposed on respective upper ends of the channel patterns 15A. Second pads 17B may be disposed on respective upper ends of the dummy channel patterns 15B. The first pads 17A may come into contact with the channel patterns 15A, and electrically couple the channel patterns 15A with the bit lines 22. The second pads 17B may come into direct contact with the dummy channel patterns 15B, and electrically couple the dummy channel patterns 15B with the well pick-up line 23. Third pads 17D may be disposed on respective upper ends of the separate patterns 15D. Referring to FIG. 1A, the third pads 17D may electrically couple the second pads 17B arranged in the first direction I-I', to each other. Furthermore, the second pads 17B and the third pads 17D may be a single layer formed through the same process.

Each of the first to third pads 17A, 17B and 17D may include an impurity. The first pads 17A and the second and third pads 17B and 17D may include different types of impurities. For example, the first pads 17A may include an N-type impurity, and the second and third pads 17B and 17D may include a P-type impurity.

The supports 18 may be disposed between the adjacent coupling patterns 15C. The supports 18 are substantially disposed at the same level with that of the coupling patterns 15C, and interposed between the coupling patterns 15C to support the stack ST. The cross-section of each coupling pattern 15C may have various shapes, such as a line, a circle, an ellipse, a rectangle, and a polygon.

Referring to FIG. 1C, the supports 18 are disposed between the first openings OP1 in which the channel patterns 15A are formed and the second openings OP2 in which the dummy channel patterns 15B are formed. For example, each of the supports 18 may be disposed between the first openings OP1 adjacent to each other in the first direction I-I' or between the second openings OP2 adjacent to each other in the first direction I-I', and may extend in a diagonal direction intersecting the first and second directions I-I' and II-II'. In addition, the supports 18 may be disposed to partially overlap the adjacent channel patterns 15A or the adjacent dummy channel patterns 15B.

The memory layers 14 may respectively enclose the channel layers 15, and include stacked dielectric layers. For example, each of the memory layers 14 includes a tunnel insulating layer, a data storage layer, and an electric charge blocking layer. The data storage layer may be a floating gate or a charge trap layer, and include silicon, a nitride, phase change material, nanodots, and so forth. Furthermore, the memory layers 14 may include memory patterns 14A enclosing the respective channel patterns 15A, dummy memory patterns 14B enclosing the respective dummy channel patterns 15B, a dummy memory pattern 14C enclosing the coupling pattern 15C, and dummy memory patterns 14D enclosing the respective separate patterns 15D.

The source layer 11 may be disposed below the coupling patterns 15C of the channel layers 15 and the supports 18. The source layer 11 may include a metal layer 11A, a first polysilicon layer 11B, and a second polysilicon layer 11C which are successively stacked. The metal layer 11A may be a titanium nitride layer. The first polysilicon layer 11B may be a polysilicon layer which contains an N-type impurity at a first concentration. The second polysilicon layer 11C may be a polysilicon layer which contains an N-type impurity at a second concentration less than the first concentration.

Although not illustrated in the drawings, a lower structure such as a peripheral circuit may be disposed below the source layer 11.

The source pick-up line 21 may penetrate the stack ST and electrically couple the channel layers 15 with the source layer 11. The source pick-up line 21 may have a depth to partially pass through the source layer 11 and, in for example, have a depth to partially pass through the second polysilicon layer 11C of the source layer 11. The source pick-up line 21 may make direct contact with the coupling patterns 15C of the channel layers 15 and the source layer 11.

The source pick-up line 21 is disposed in a slit SL passing through the stack ST, and extends in the first direction I-I'. For example, the slit SL has a depth to completely pass through the stack ST and expose the source layer 11. The slit SL may be disposed on a boundary of the adjacent memory blocks MB1 and MB2, or disposed in each of the memory blocks MB1 and MB2. Furthermore, the spacer 19 is formed along an inner surface of the slit SL, and the source pick-up line 21 may be disposed in the slit SL on which the spacer 19 is formed. Therefore, the source pick-up line 21 is insulated from the conductive layers 12. The spacer 19 may be an insulating layer including an oxide.

The bit lines 22 may be disposed over the stack ST, and be electrically coupled with the channel patterns 15A through the first pads 17A. The well pick-up line 23 may be disposed over the stack ST, and be electrically coupled with the dummy channel patterns 15B through the second pads 17B.

Figure 3B:
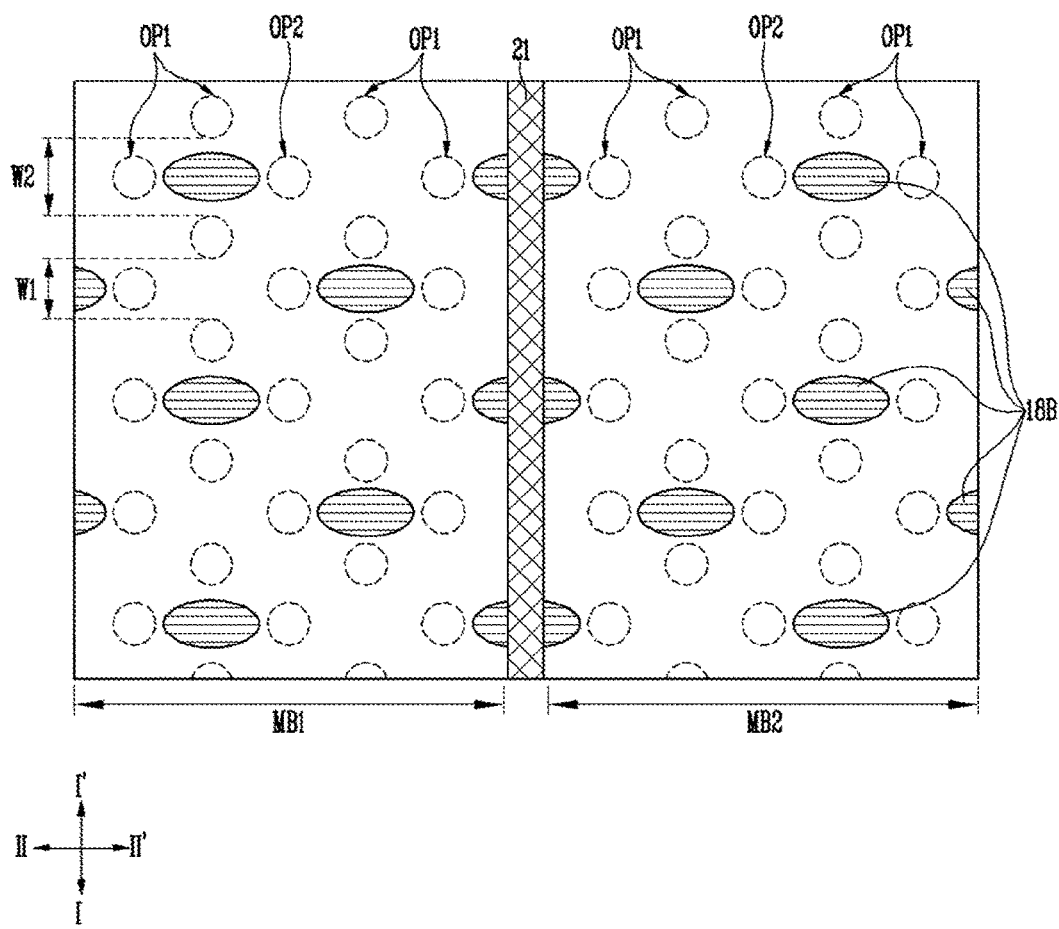

FIGS. 3A and 3B are layout diagrams illustrating the structure of the semiconductor device according to an embodiment of the present disclosure. Hereinafter, various shapes of the support will be described with reference to the drawings.

Referring to FIG. 3A, each of the supports 18A may have a line shape extending in a diagonal direction intersecting the first and second directions I-I' and II-II'. Furthermore, the supports 18A may be disposed between the first openings OP1 adjacent to each other in the first direction I-I' and between the second openings OP2 adjacent to each other in the first direction I-I', and may be intermittently disposed. For instance, the first openings OP1 arranged in the first direction I-I' may be disposed with a first distance W1 therebetween or with a second distance W2 greater than the first distance W1. In this case, the supports 18A may be disposed only between the first openings OP1 that are arranged with the second distance W2 therebetween, and only between the second openings OP2 that are arranged with the second distance W2 therebetween.

Referring to FIG. 3B, each of the supports 18B may have a pillar shape and an elliptical cross-section. Furthermore, the supports 18B may be disposed between the first openings OP1 adjacent to each other in the first direction I-I' or between the second openings OP2 adjacent to each other in the first direction I-I', and may be intermittently disposed. For example, the supports 18B may be disposed only between the first openings OP1 that are arranged with a relatively long second distance W2 therebetween, or only between the second openings OP2 that are arranged with the relatively long second distance W2 therebetween.

Figure 4A:
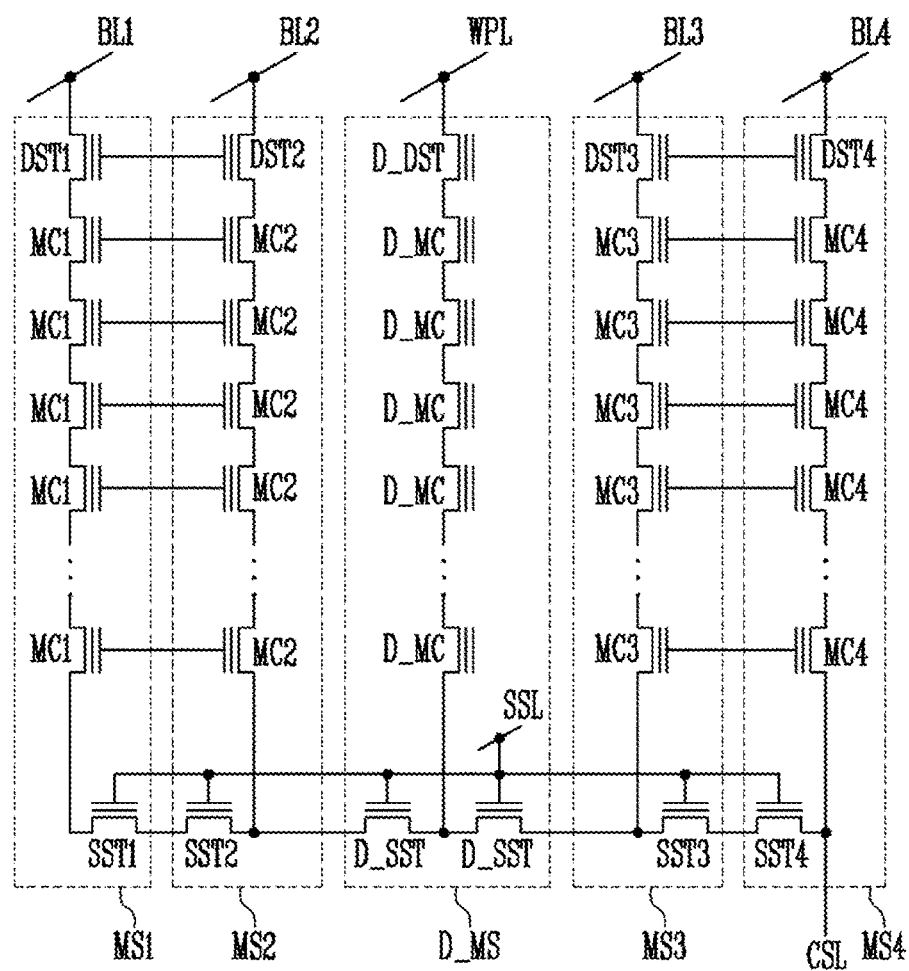
FIGS. 4A to 4C are diagrams illustrating the operational principle of a semiconductor device according to an embodiment of the present disclosure.
Figure 4B:
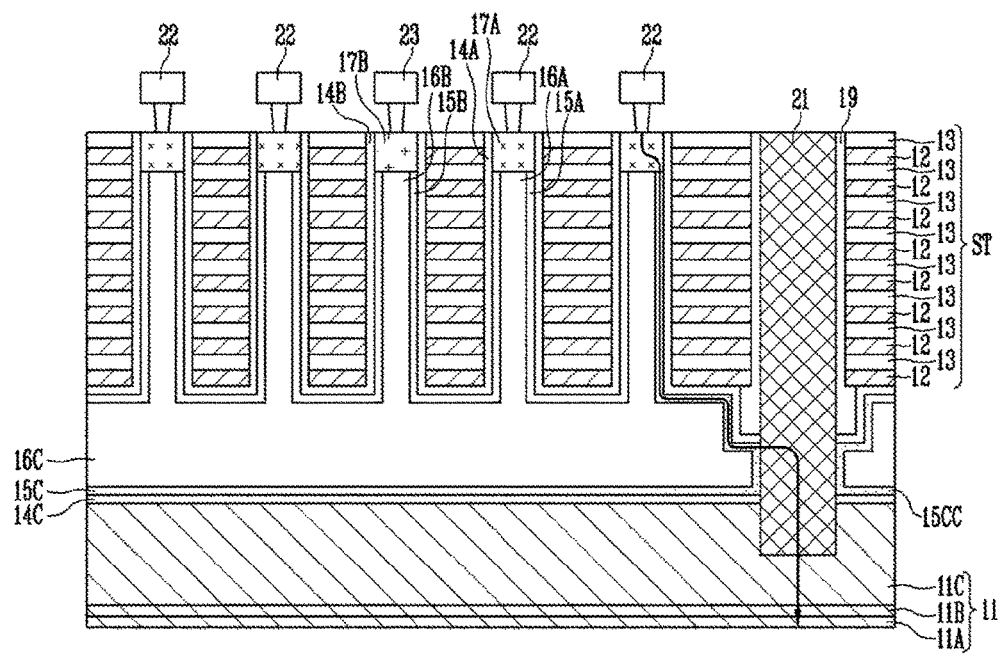
Figure 4C:
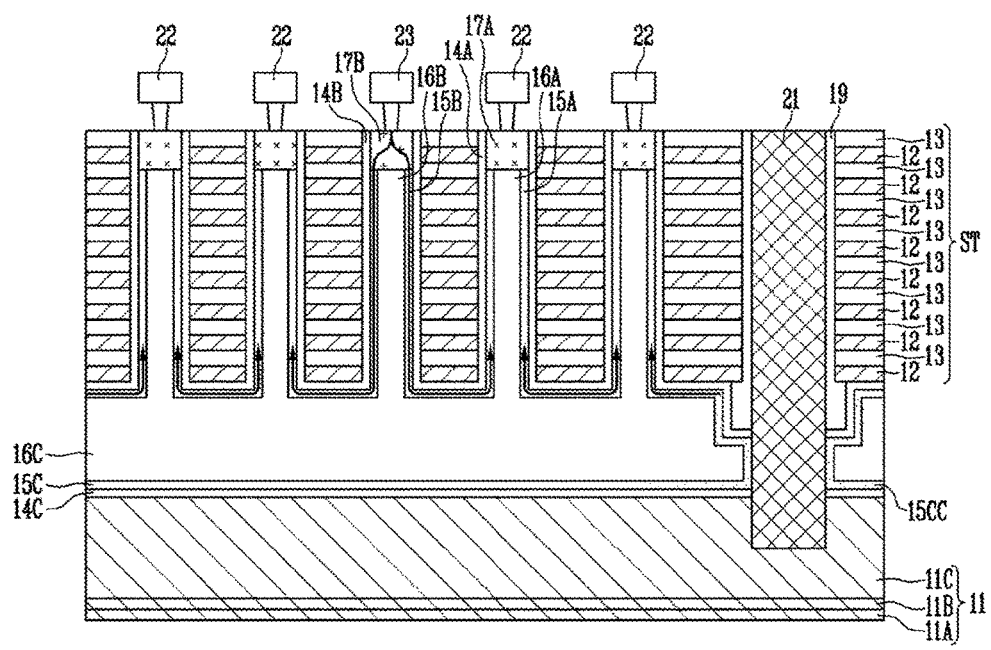

FIG. 4A is a circuit diagram of a cell array according to an embodiment of the present disclosure. FIGS. 4B and 4C are sectional view illustrating the operational principle of a semiconductor device according to an embodiment of the present disclosure.

Referring to FIG. 4A, a first memory string MS1 may include at least one first drain select transistor DST1, a plurality of first memory cells MC1, and at least one first source select transistor SST1, and may be coupled between a first bit line BL1 and a common source line CSL. A second memory string MS2 may include at least one second drain select transistor DST2, a plurality of second memory cells MC2, and at least one second source select transistor SST2, and may be coupled between a second bit line BL2 and the common source line CSL. A third memory string MS3 may include at least one third drain select transistor DST3, a plurality of third memory cells MC3, and at least one third source select transistor SST3, and may be coupled between a third bit line BL3 and the common source line CSL. Furthermore, a fourth memory string MS4 may include at least one fourth drain select transistor DST4, a plurality of fourth memory cells MC4, and at least one fourth source select transistor SST4, and may be coupled between a fourth bit line BL4 and the common source line CSL.

A dummy memory string D_MS may include at least one dummy drain select transistor D_DST, a plurality of dummy memory cells D_MC, and at least one dummy source select transistor D_SST, and may be coupled between a well pick-up line WPL and the common source line CSL.

Here, channel patterns of the first to fourth source select transistors SST1 to SST4 and dummy channel patterns of the dummy source select transistors D_SST are coupled to each other by a coupling pattern. In addition, the first to fourth source select transistors SST1 to SST4 and gate electrodes of the dummy select transistors D_SST are coupled with the same source select line SSL.

Referring to FIGS. 4A and 4B, during a read operation, an operating voltage Vcc is applied to the source select line SSL so that the first to fourth source select transistor SST1 to SST4 and the dummy source select transistors D_SST are turned on. Thereby, a channel is formed in the coupling pattern 15C between the channel patterns 15A and the source pick-up line 21. Therefore, current flows to the source layer 11 through the channel patterns 15A, the coupling pattern 15C, and the source pick-up line 21. For reference, it is also possible for current to flow to the channel patterns 15A, the coupling pattern 15C, and the source pick-up line 21 or flow to the channel patterns 15A, the coupling pattern 15C and the source layer 11.

Referring to FIGS. 4A and 4C, during an erase operation, an erase voltage Vers is applied to the well pick-up line (WPL) 23. Thereby, holes may be injected into the channel patterns 15A through the second pads 17B, the dummy channel patterns 15B and the coupling pattern 15C. Therefore, the erase operation may be performed by a well erasing method.

FIGS. 5 to 16 are views illustrating a method of manufacturing a semiconductor device according to an embodiment of the present disclosure. The drawings attached with reference character A are layout diagrams, and the drawings attached with reference character B are sectional views taken along D-D' and E-E' of the drawings with reference character A.

Figure 5:
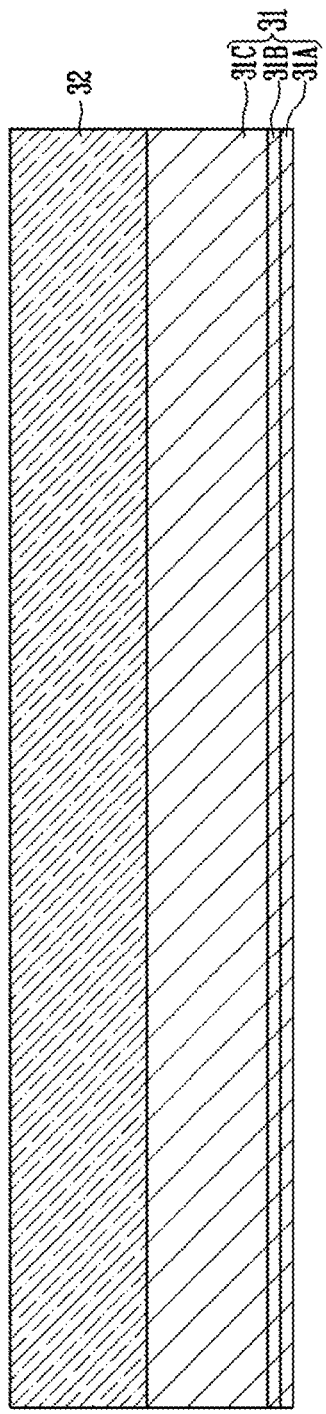

Referring to FIG. 5, a source layer 31 is formed on a substrate in which a lower structure such as a peripheral circuit has been formed. For example, a metal layer 31A, a first polysilicon layer 31B and a second polysilicon layer 31C are successively formed. Each of the metal layer 31A and the polysilicon layer 31B may have a thickness less than that of the second polysilicon layer 31C. For example, the metal layer 31A may be a titanium nitride layer. The first polysilicon layer 31B may be a polysilicon layer which contains an N-type impurity at a first concentration. The second polysilicon layer 31C may be a polysilicon layer which contains the N-type impurity at a second concentration less than the first concentration.

Subsequently, a support layer 32 is formed on the source layer 31. The support layer 32 may not only function as a mold for a coupling pattern to be formed through a following process, but may also be provided to form a support for supporting a stack. The support layer 32 may be a dielectric layer such as an oxide layer.

Figure 6A:
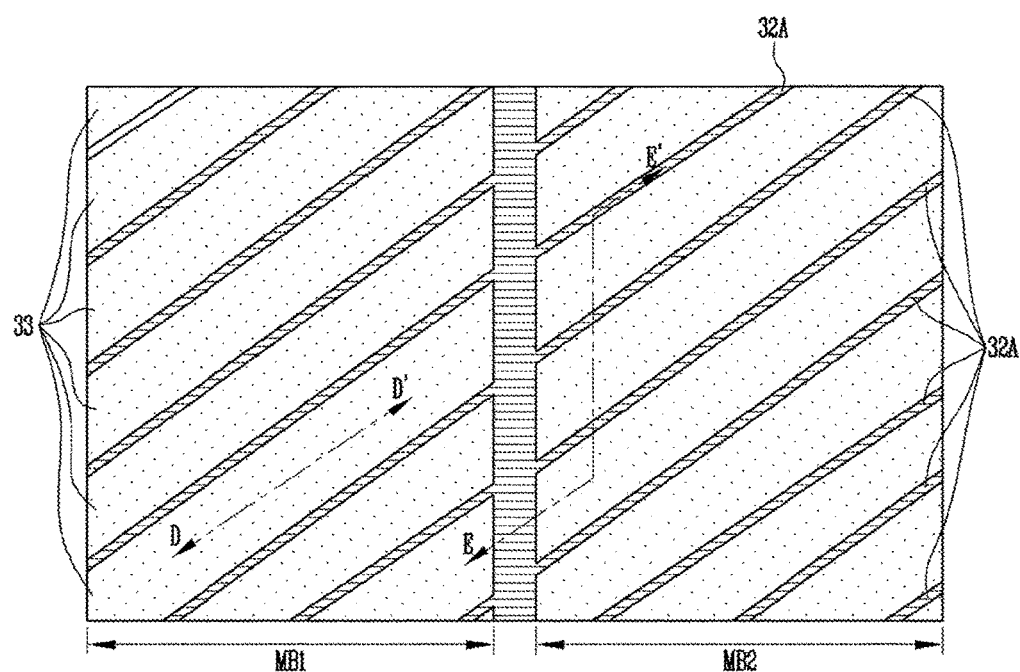

Referring to FIGS. 6A and 6B, supports 32A are formed by patterning the support layer 32. A cross-section of each of the supports 32A may have various shapes such as a circle, an ellipse, and a line. The supports 32A may be formed by patterning the support layer 32 only in the memory blocks MB1 and MB2 without patterning the support layer 32 on a boundary between the adjacent memory blocks MB1 and MB2.

Thereafter, first sacrificial layers 33 are formed between the supports 32A. The supports 32A functions as a mold and the first sacrificial layers 33 are formed in empty spaces between the supports 32A. For instance, after a material layer is formed to fill each empty space between the supports 32A, the first sacrificial layers 33 are formed by performing a planarization process until upper surfaces of the supports 32A are exposed. The first sacrificial layers 33 may be made of material having an etch selectivity relative to the support layer 32, and may be a titanium nitride layer.

Referring to FIGS. 7A and 7B, an etch stop layer 34 is formed. For example, after a trench T is formed by etching portions of the first sacrificial layer 33 and the support 32A to a predetermined depth, the etch stop layer 34 is formed in the trench T. The etch stop layer 34 may be made of material having a high etch selectivity relative to first and second material layers to be formed through a following process. For instance, the etch stop layer 34 may be an undoped polysilicon layer.

The etch stop layer 34 may be disposed in the boundary between the adjacent memory blocks MB1 and MB2. Therefore, a depth of a second slit may be controlled during a following second slit forming process. In addition, the etch stop layer 34 may have a width greater than that of each support 32A (W4>W3). As a result, a sidewall of a third opening to be formed through a following process may have a stepped structure, and a dummy memory pattern may be easily removed during a second slit expansion process.

Figure 8B:
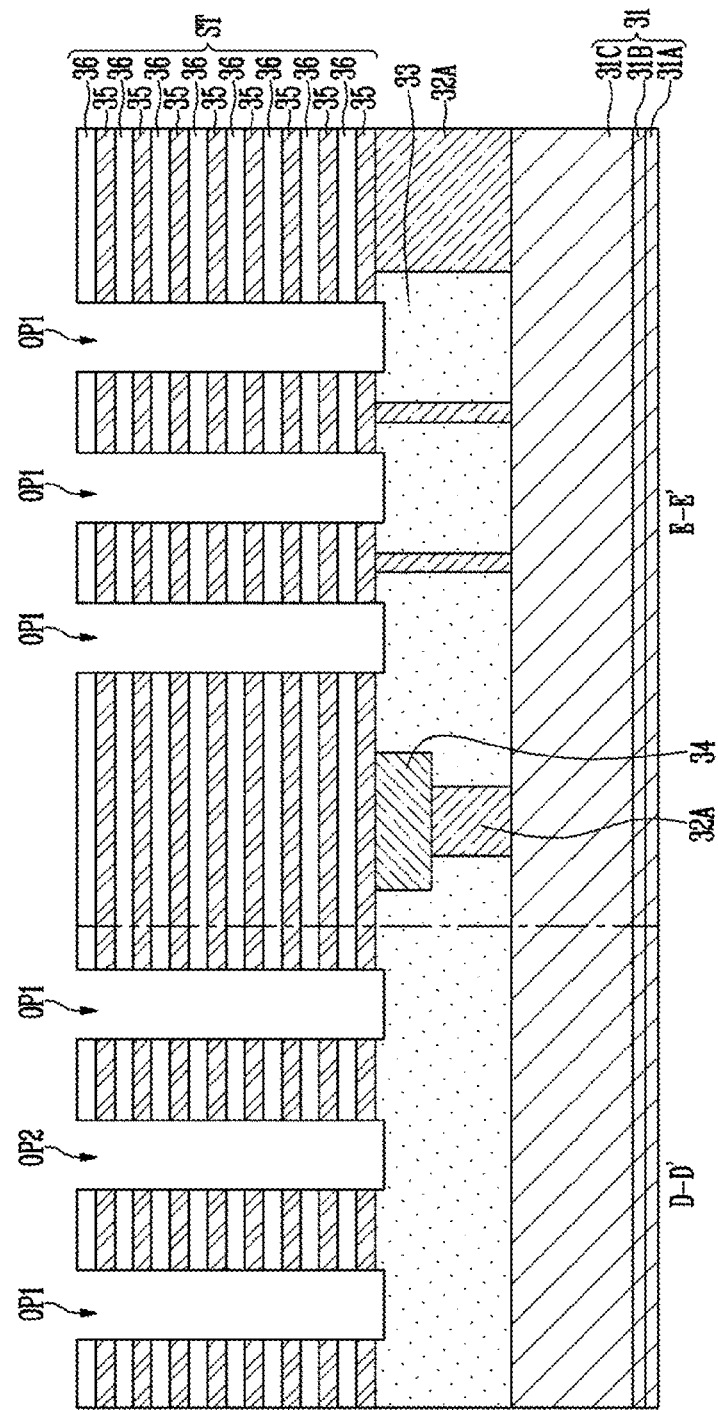

Referring to FIGS. 8A and 8B, a stack ST is formed by alternately stacking first material layers 35 and second material layers 36. The stack ST may be provided to form memory strings including memory cells that are vertically stacked, and may have a high aspect ratio.

The first material layers 35 may be provided to form memory cells, gate electrodes of select transistors, and the like. The second material layers 36 may be provided to insulate the stacked gate electrodes from each other. Here, the first material layers 35 are made of material having a high etch selectivity with respect to the second material layers 36. For example, the first material layers 35 may be sacrificial layers including nitride or the like, and the second material layers 36 may be insulating layers including oxide or the like. Alternatively, the first material layers 35 may be conductive layers including polysilicon, tungsten, or the like, and the second material layers 36 may be insulating layers including oxide or the like. As a further alternative, the first material layers 35 may be conductive layers including doped polysilicon or the like, and the second material layers 36 may be sacrificial layers including undoped polysilicon or the like.

Subsequently, first and second openings OP1 and OP2 are formed passing through the stack ST. For example, the first openings OP1 arranged in the first direction I-I' and the second direction II-II' intersecting the first direction I-I' and the second openings OP2 disposed between the first openings OP1 are formed passing through the stack ST. Each of the second openings OP2 may be disposed between the corresponding four first openings OP1 disposed adjacent to each other in the first direction I-I' and the second direction II-II'. For example, the second openings OP2 may be arranged to be misaligned with the first openings OP1 such that central regions of the first and second openings OP1 and OP2 are offset from each other.

The first openings OP1 and the second openings OP2 may be simultaneously formed and have the same shape and depth.

Furthermore, a cross-section of each of the first and second openings OP1 and OP2 may have various shapes such as a circle, an ellipse, a rectangle, and a polygon.

Figure 9A:
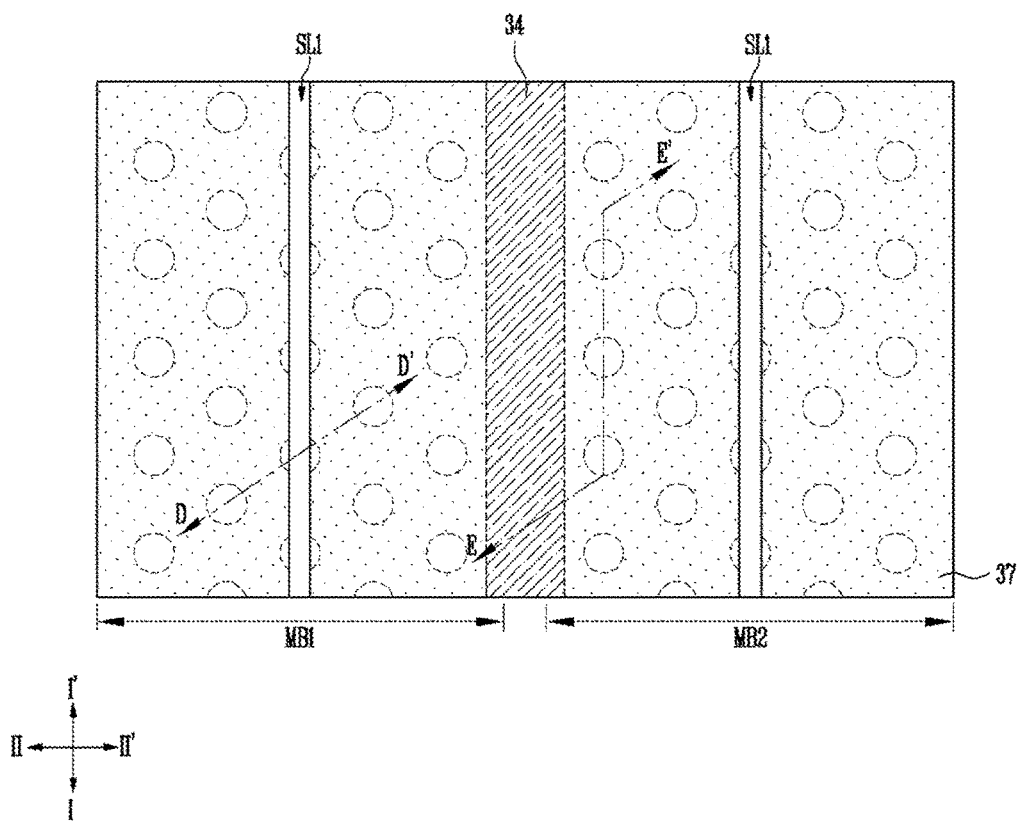

Referring to FIGS. 9A and 9B, a second sacrificial layer 37 is formed in the first openings OP1 and the second openings OP2. For example, the second sacrificial layer 37 is formed such that the first opening OP1 and the second openings OP2 are filled therewith. The second sacrificial layer 37 may also be formed on the stack ST. The second sacrificial layer 37 is made of material having a high etch selectivity with respect to the first and second material layers 35 and 36. For instance, the second sacrificial layer 37 may be a spin on coating (SOC) layer.

For reference, after the second sacrificial layer 37 has been formed, an additional process may be performed. For example, the second sacrificial layer 37 may be planarized such that the upper surface of the stack ST is exposed, before a process of forming the stack, the first openings, the second openings and the second sacrificial layer is repeatedly performed. In this case, since the stack with a high aspect ratio is formed through a predetermined number of times of processes, the first and second openings may be easily formed with a uniform width.

Thereafter, a first slit SL1 passing through the stack ST is formed. The first slit SL1 may penetrate a portion of the stack ST to a predetermined depth and overlap the second openings OP2 arranged in the first direction I-I'. Therefore, the first slit SL1 may be formed in the stack ST and the second sacrificial layer 37 to a predetermined depth.

The first slit SL1 may be formed to a predetermined depth to which it passes through a first material layer 35 to be used for a select line among the first material layers 35. For instance, in the case where one memory string includes two drain select transistors, the first slit SL1 is formed to pass through two first material layers 35 from the uppermost of the stack. In this case, a bottom surface of the first slit SL1 may be disposed at a level equal to or higher than that of an upper surface of first material layer to be used for an uppermost word line among the first material layers 35.

Furthermore, the first slit SL1 may have a width less than that of each second opening OP2. For example, in the case where each second opening OP2 has a circular cross-section, the first slit SL1 may have a width less than a diameter of the second opening OP2. In addition, the first slit SL1 may be disposed such that the center thereof is aligned with that of the second openings OP2 or such that the center thereof is misaligned with that of the second openings OP2.

Figure 10:
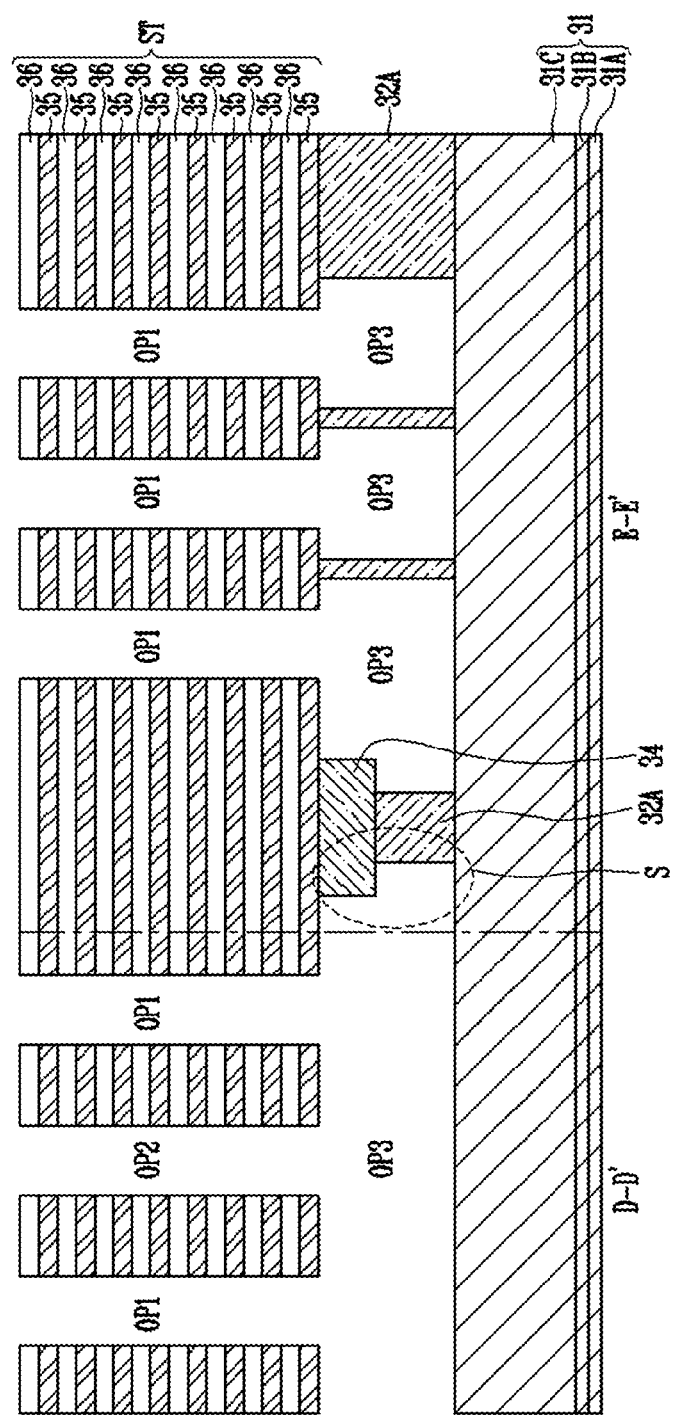

Referring to FIG. 10, the second sacrificial layer 37 is removed. For example, the second sacrificial layer 37 is selectively etched so that the first openings OP1 and the second openings OP2 are open again. As the second sacrificial layers 33B are removed, the second openings OP2 and the first slit SL1 are integrally coupled to each other. In other words, the second openings OP2 are coupled with each other through the first slits SL1.

Subsequently, the first sacrificial layers 33 are removed through the first and second openings OP1 and OP2, whereby third openings OP3 are formed. The third openings OP3 are disposed under the stack ST, and the adjacent third openings OP3 are separated from each other by the supports 32A. Since the supports 32A support the stack ST, even when the first sacrificial layers 33 are removed, the stack ST may be prevented from inclining or collapsing. In addition, since the etch stop layer 34 has a width greater than that of each support 32A, a sidewall of the third openings OP3 may have a stepped structure S.

Figure 11B:
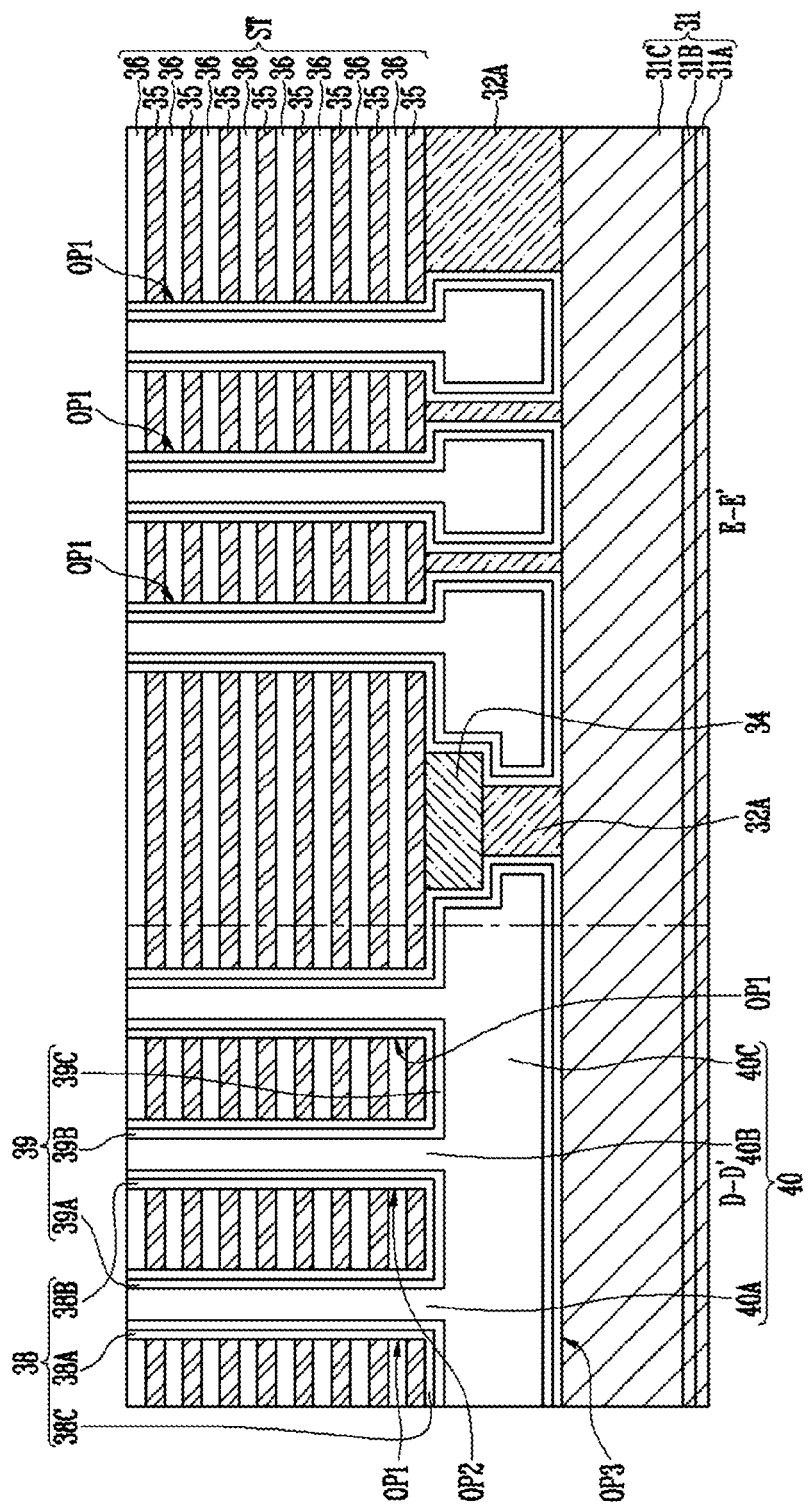

Referring to FIGS. 11A and 11B, memory layers 38, channel layers 39 and gap fill insulating layers 40 are successively formed in the first to third openings OP1 to OP3 and the first slit SL1. For example, after the memory layers 38, the channel layers 39, and the gap fill insulating layers 40 have been successively formed on the whole surface of the stack ST including the first to third openings OP1 to OP3 and the first slit SL1, a planarization process is performed until the surface of the stack ST is exposed. Here, the gap fill insulating layers 40 may be polysilazane (PSZ) layers.

Each of the memory layers 38 includes memory patterns 38A in the first openings OP1, dummy memory patterns 38B in the second openings OP2, dummy memory patterns 38D in the first slit SL1, and a dummy memory pattern 38C in the third opening OP3. Each of the channel layers 39 includes channel patterns 39A in the first openings OP1, dummy channel patterns 39B in the second openings OP2, separate patterns 39D in the first slit SL1, and a coupling pattern 39C in the third opening OP3.

Furthermore, each of the gap fill insulating layers 40 includes gap fill insulating patterns 40A in the channel patterns 39A, dummy gap fill insulating patterns 40B in the dummy channel patterns 39B, dummy gap fill insulating patterns 40D in the separate patterns 39D, and a dummy gap fill insulating pattern 40C in the coupling pattern 39C. The dummy gap fill insulating pattern 40C may be a base part. The gap fill insulating patterns 40A may be first protrusions protruding from an upper surface of the base part. The dummy gap fill insulating patterns 40B may be second protrusions protruding from the upper surface of the base part.

The dummy memory patterns 38D couple the dummy memory patterns 38B to each other. The separate patterns 39D couple the dummy channel patterns 39B to each other. The dummy gap fill insulating patterns 40D couple the dummy gap fill insulating patterns 40B to each other. For reference, depending on the width of the first slit SL1, all of the dummy memory patterns 38D, the dummy channel patterns 39D and the dummy gap fill insulating patterns 40D may be formed in the first slit SL1, or only some of them may be formed in the first slit SL1. For instance, only the dummy memory patterns 38D may be formed in the first slit SL1, or only the dummy memory patterns 38D and the dummy channel patterns 39D may be formed therein.

Figure 12A:
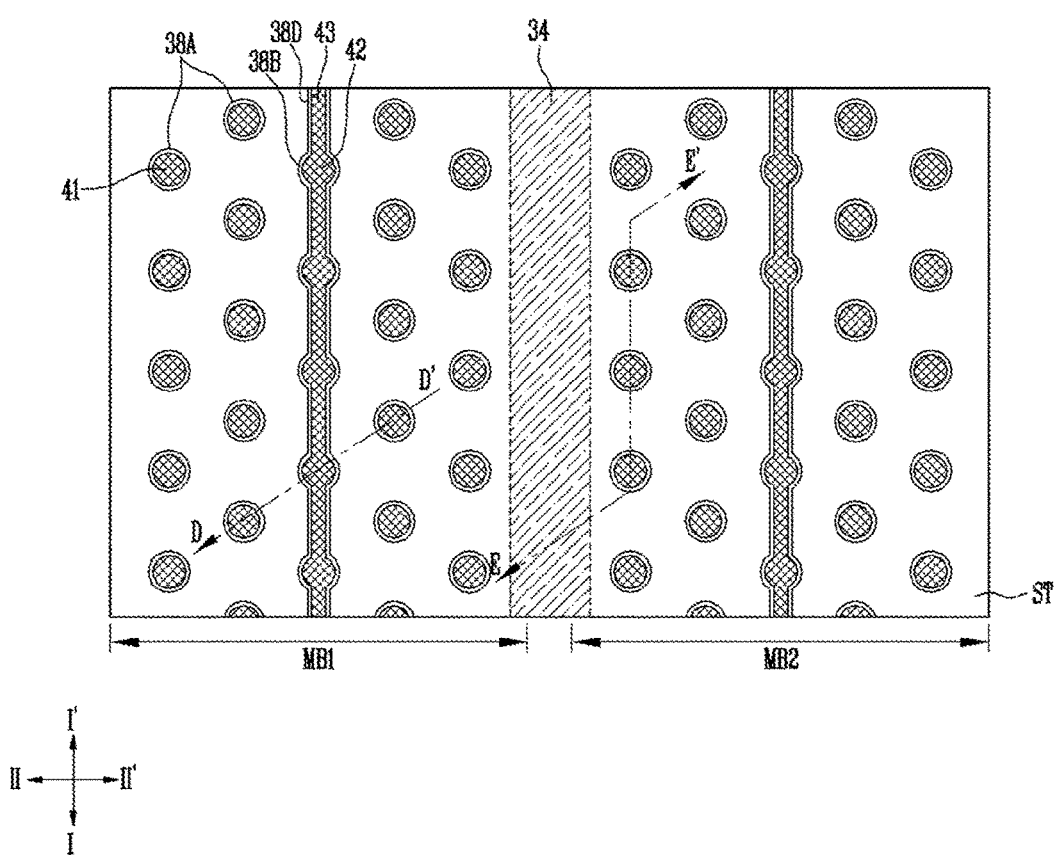
Figure 12B:
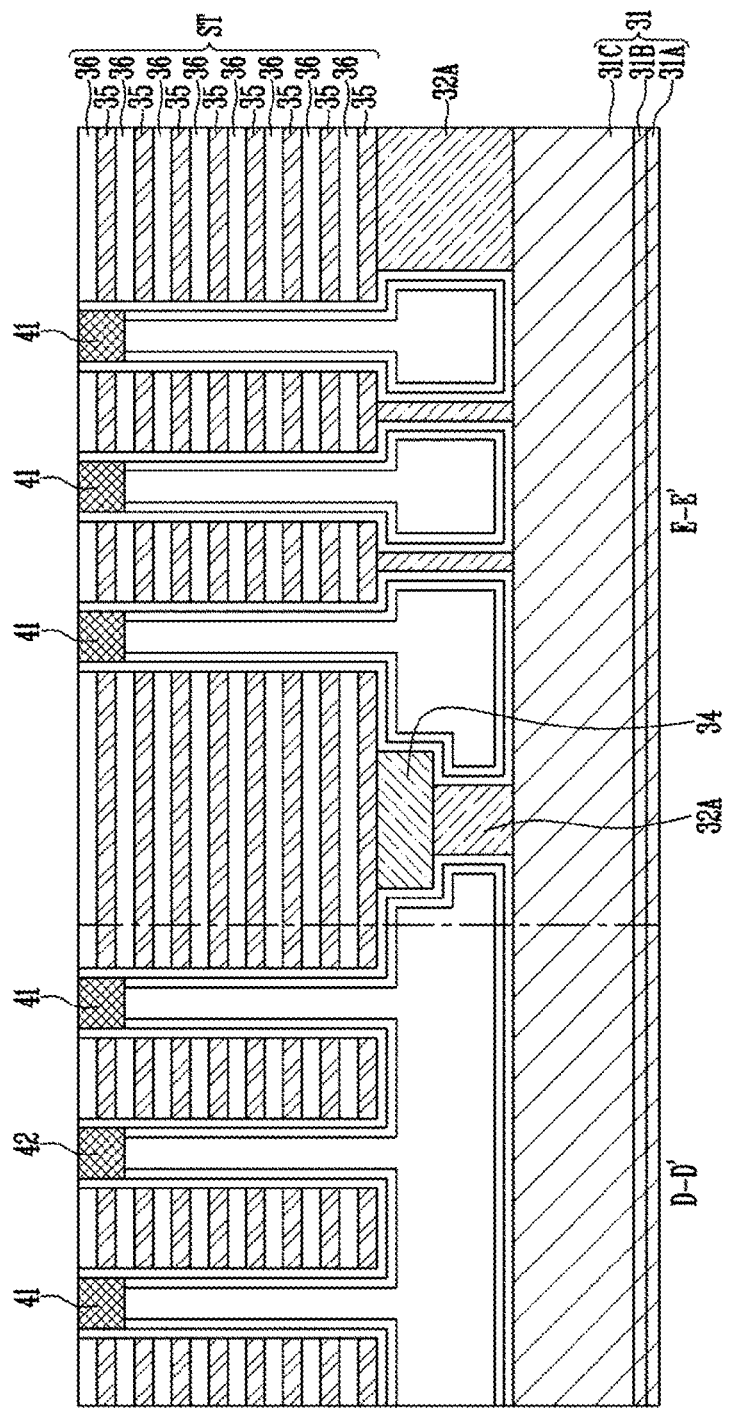

Referring to FIGS. 12A and 12B, recess regions are formed by etching portions of the dummy gap fill insulating patterns 40A and 40B in the channel patterns and the dummy channel patterns 39A and 39B to a predetermined depth. For example, the bottom of each recess region may be disposed below the bottom of the uppermost first conductive layer 35. Subsequently, first and second pads 41 and 42 are formed in the recess regions. The first pads 41 are respectively coupled with the channel patterns 39A, and the second pads 42 are respectively coupled with the dummy channel patterns 39B.

Furthermore, third pads 43 may be formed together when the first and second pads 41 and 42 are formed. For instance, after the recess regions are formed by etching the dummy gap fill insulating patterns 40D in the separate patterns 39D to a predetermined depth, the third pads 43 coupled with the separate patterns 39D are formed in the recess regions. In this case, the first to third pads 41 to 43 may be made of the same material through the same process. In addition, the second pads 42 and the third pads 43 may be alternately arranged in the first direction I-I', and may be a single layer integrally coupled to each other. For example, the first to third pads 41 to 43 may be undoped polysilicon layers.

Figure 13A:
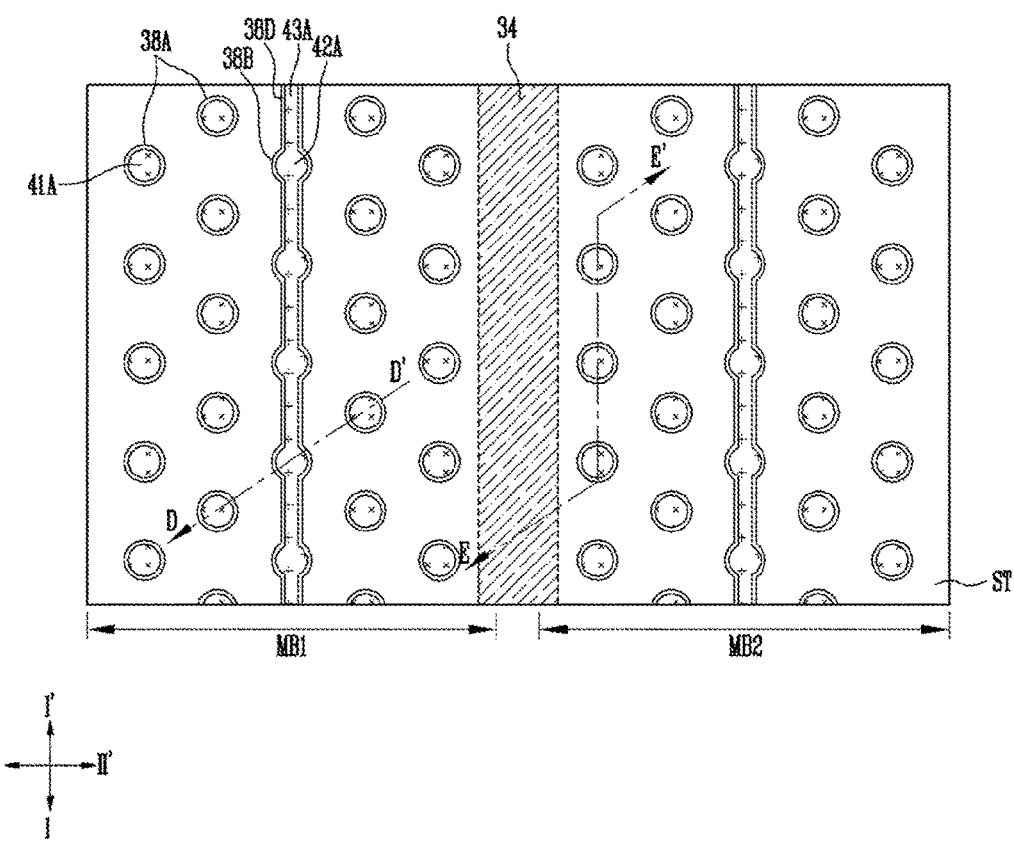
Figure 13B:
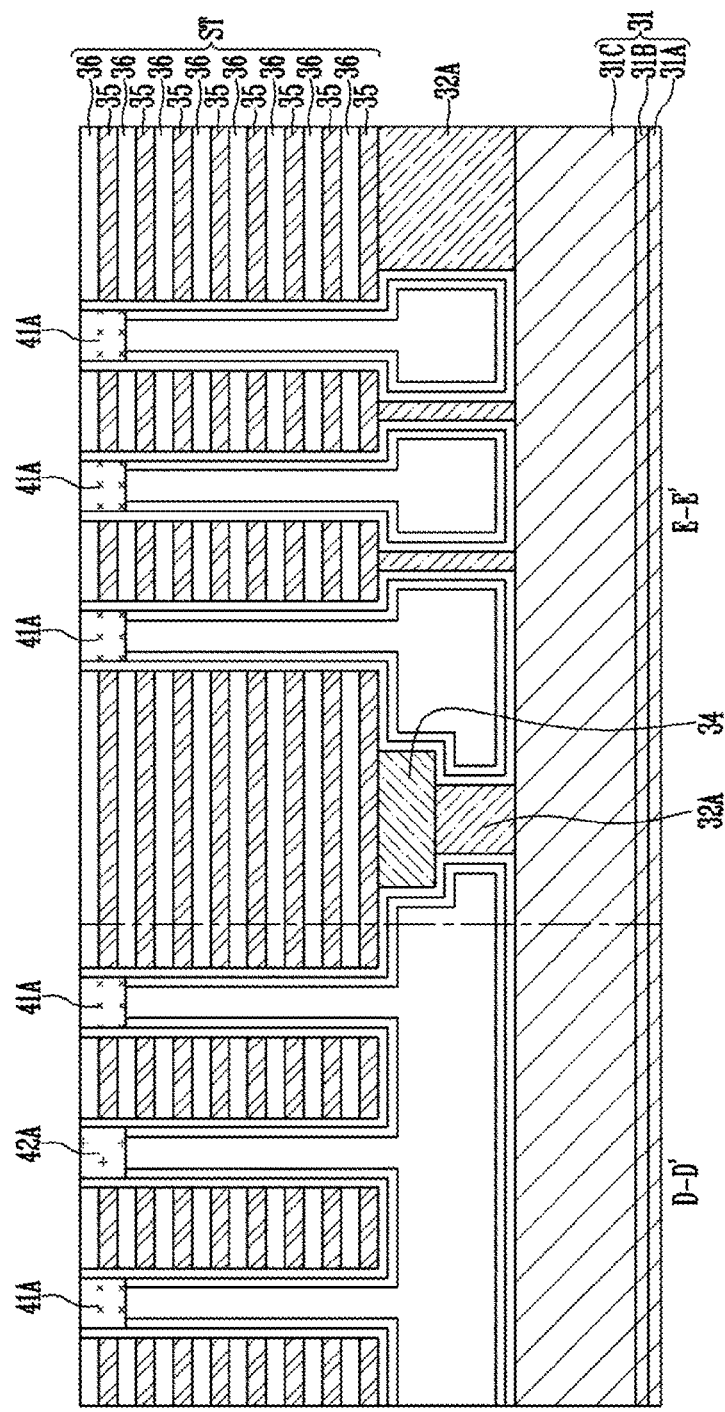

Referring to FIGS. 13A and 13B, a first type impurity is selectively doped into each first pad 41, whereby first pads 41A doped with the impurities are formed. Furthermore, a second type impurity is selectively doped into each of the second and third pads 42 and 43, whereby second and third pads 42A and 43A doped with the impurities are formed. For example, a first mask which covers the first pads 41 and exposes the second and third pads 42 and 43 is formed on the stack ST, and P-type impurities are thereafter doped into the second and third pads 42 and 43 using the first mask as a barrier. Subsequently, a second mask which covers the second and third pads 42A and 43A doped with impurities and exposes the first pads 41 is formed. Thereafter, N-type impurities are doped into the first pads 41 using the second mask as a barrier. In this way, the second and third pads 42A and 43A containing the P-type impurities and the first pads 41A containing the N-type impurities are formed.

Figure 14:
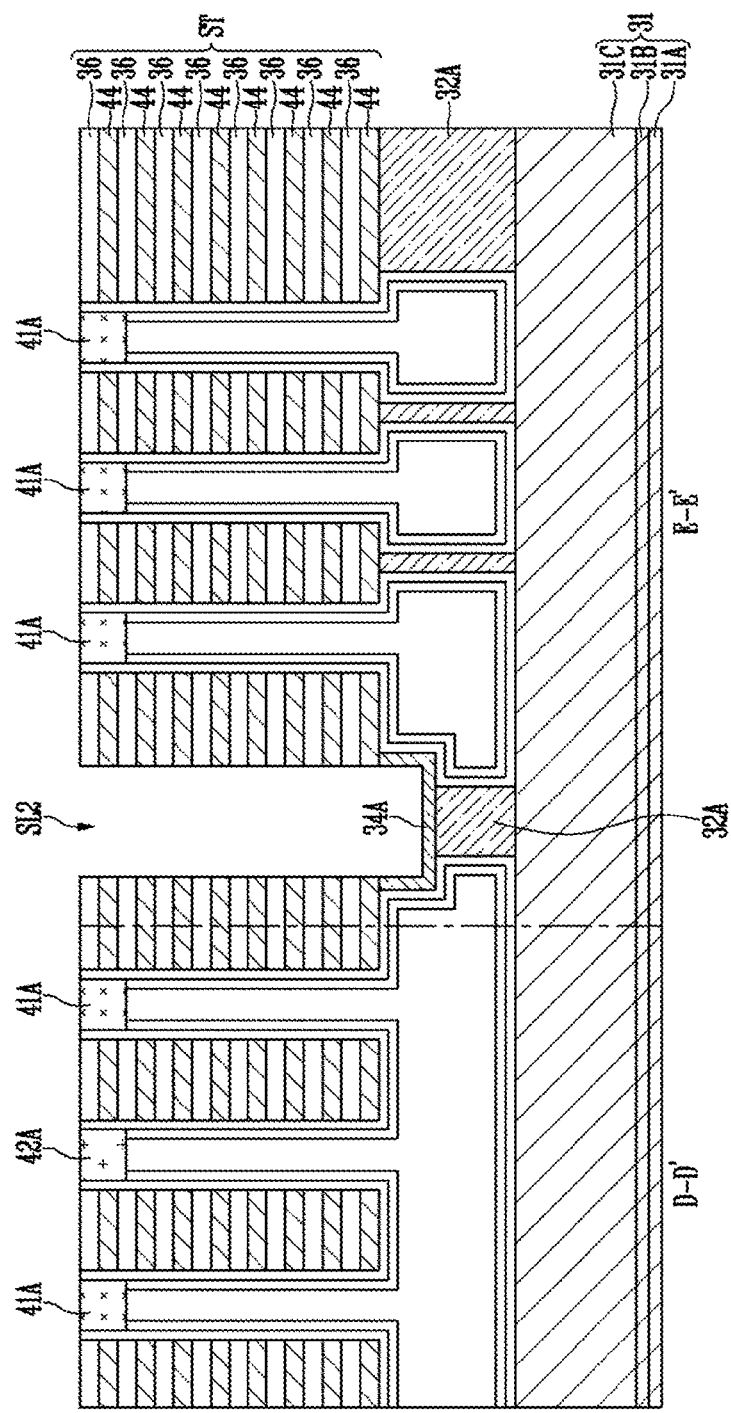

Referring to FIG. 14, a second slit SL2 passing through the stack ST is formed. The second slit SL2 may have a depth to expose the etch stop layer 34, and a partial etch stop layer 34A may remain on the bottom of the second slit SL2. Thanks to the etch stop layer 34, the depth of the second slit SL2 may be easily controlled, and the slit SL2 may be prevented from completely passing through the support 32A, whereby the source layer 31 may be prevented from being exposed. In addition, the second slit SL2 has a width less than that of the etch stop layer 34. Therefore, even if the second slit SL2 is misaligned, the source layer 31 may be prevented from being exposed.

Thereafter, the first material layers 35 or the second material layers 36 are replaced with third material layers 44 through the second slit SL2. In an embodiment, when the first material layers 35 are sacrificial layers and the second material layers 36 are insulating layers, the first material layers 35 are selectively removed through the second slit SL2 to form fourth openings, and conductive layers are thereafter formed in the respective fourth openings. In an embodiment, when the first material layers 35 are conductive layers and the second material layers 36 are insulating layers, the first material layers 35 may be silicidized through the second slit SL2. In an example, when the first material layers 35 are conductive layers and the second material layers 36 are sacrificial layers, the second material layers 36 are selectively removed through the second slit SL2 to form fourth openings, and insulating layers are thereafter formed in the respective fourth openings. Due to the etch stop layer 34A remaining on the bottom of the second slit SL2, lower layers may be prevented from being exposed or damaged.

Figure 15:
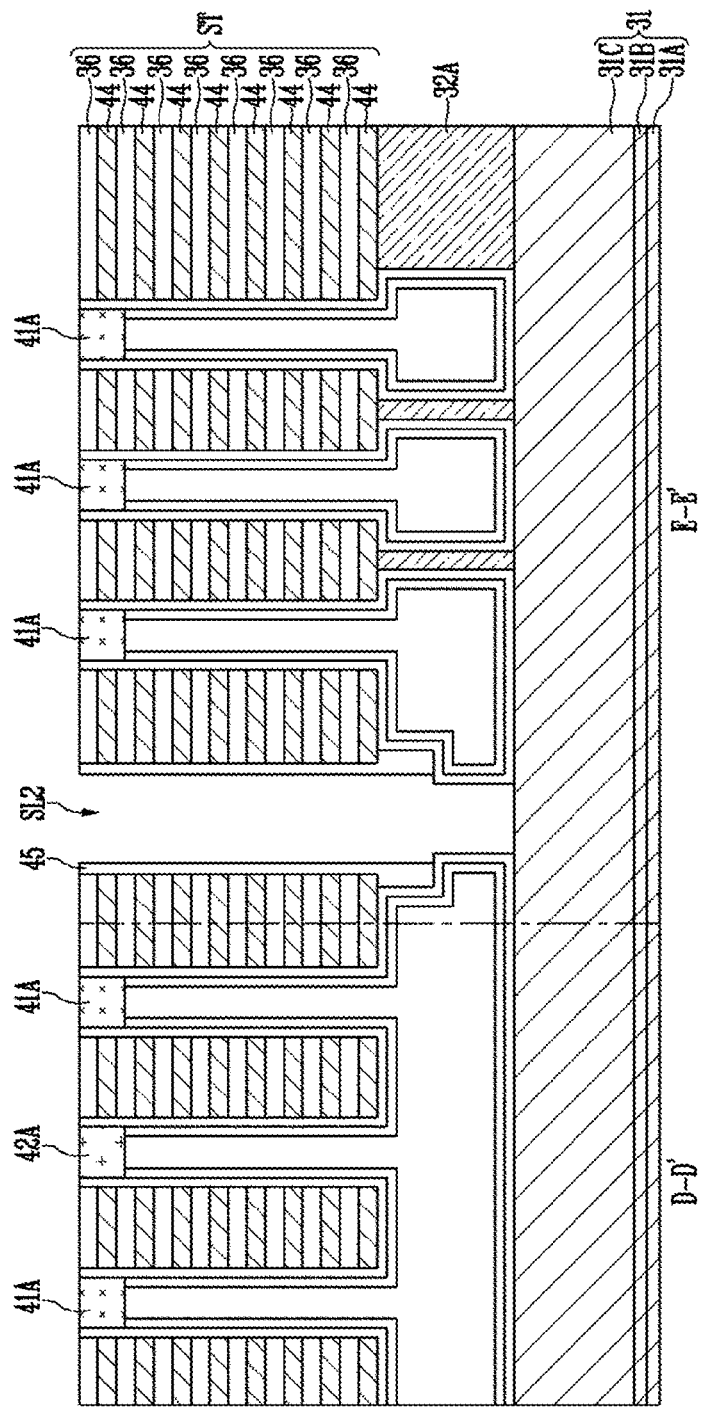

Referring to FIG. 15, the remaining etch stop layer 34A is removed through the second slit SL2. Subsequently, a spacer 45 is formed on an inner sidewall of the second slit SL2. For instance, after a material layer to be used for the spacer has been formed on an inner surface of the slit SL2, a portion of the material layer for the spacer that is formed on the bottom of the second slit SL2 may be removed through an etch-back process. In this way, the spacer 45 which covers the inner sidewall of the second slit SL2 may be formed. The spacer 45 may be an oxide layer.

Referring to FIG. 16, the second slit SL2 extends downward. For example, the memory layer 38 and the supports 32A which are exposed on the bottom of the second slit SL2 are etched using the spacer 45 as an etch barrier, whereby the source layer 31 is exposed. Here, the source layer 31 may be partially etched to a predetermined depth, and the second polysilicon layer 31C may be exposed on the bottom of the second slit SL2.

Furthermore, since the dummy memory pattern 38C is formed to enclose the stepped structure formed on the sidewall of the coupling pattern 39C, a partial region thereof protrudes toward the second slit SL2. Therefore, the protruding region of the dummy memory pattern 38C is exposed without being covered by the spacer 45, and is thus etched during the process of expanding the second slit SL2. Consequently, the coupling patterns 39C are exposed in the expanded second slit SL2.

Subsequently, a source pick-up line 46 is formed in the second slit SL2. For example, the source pick-up line 46 may be formed by forming a conductive layer to fill the second slit SL2 and planarizing the conductive layer until the upper surface of the stack ST is exposed. In this way, the source pick-up line 46 making direct contact with the coupling pattern 39C and the source layer 31 is formed. The source pick-up line 46 may be a conductive layer containing N-type impurities, and may be a metal layer including a polysilicon layer or silicide.

Thereafter, a junction 47 is formed in a region of the coupling pattern 39C which makes contact with the source pick-up line 46. For instance, the junction 47 may be formed by diffusing impurities from the source pick-up line 46 into the coupling pattern 39C through a heat treatment process. The junction 47 may contain N-type impurities.

Subsequently, bit lines 48 and a well pick-up line 49 are formed over the stack ST. The bit lines 48 are electrically respectively coupled with the first pads 41A. The well pick-up line 49 is electrically coupled with the second pad 42A.

FIG. 17 is a block diagram illustrating the configuration of a memory system according to an embodiment of the present disclosure.

Referring FIG. 17, a memory system 1000 according to an embodiment of the present disclosure includes a memory device 1200 and a controller 1100.

The memory device 1200 is used to store data information having a variety of data forms such as text, graphics, software codes. The memory device 1200 may be a non-volatile memory. Furthermore, the memory device 1200 may have a structure described above with reference to FIGS. 1A and 16, and may be manufactured by the manufacturing methods described above with reference to FIGS. 1A to 16. In an embodiment, the memory device 1200 may include a stack; channel layers including channel patterns passing through the stack, dummy channel patterns passing through the stack, and a coupling pattern which is disposed below the stack and couples the channel patterns with the dummy channel patterns; bit lines coupled with the channel patterns; and a well pick-up line coupled with the dummy channel patterns. The structure of the memory device 1200 and the manufacturing method thereof are the same as those described above; therefore, explanations thereof will be omitted.

The controller 1100 may be coupled to a host Host and the memory device 1200. The controller 1100 may access the memory device 1200 in response to a request from the host Host. For example, the controller 1100 may control read, write, erase, and background operations of the memory device 1200.

The controller 1100 includes a random access memory (RAM) 1110, a central processing unit (CPU) 1120, a host interface 1130, an error correction code (ECC) circuit 1140, a memory interface 1150.

The RAM 1110 is used as an operation memory of the CPU 1120, a cache memory between the memory device 1200 and the host Host, a buffer memory between the memory device 1200 and the host Host, and so forth. For reference, the RAM 1110 may be replaced with a static random access memory (SRAM), a read only memory (ROM), or the like.

The CPU 1120 may control the overall operation of the controller 1100. For example, the CPU 1120 is configured to operate firmware such as a flash translation layer (FTL) stored in the RAM 1110.

The host interface 1130 is configured to interface with the host Host. For example, the controller 1100 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The ECC circuit 1140 may use an error correction code (ECC) to detect and correct errors in data read from the memory device 1200.

The memory interface 1150 is configured to interface with the memory device 1200. For example, the memory interface 1150 may include a NAND interface or a NOR interface.

For reference, the controller 1100 may further include a buffer memory (not illustrated) for temporarily storing data. The buffer memory may be used to temporarily store data to be transferred from the host interface 1130 to an external device or data to be transferred from the memory interface 1150 to the memory device 1200. In addition, the controller 1100 may further include a ROM that stores code data for interfacing with the host Host.

Since the memory system 1000 according to an embodiment may include the memory device 1200 having improved integration and characteristics, the integration and characteristics of the memory system 1000 may also be improved.

FIG. 18 is a block diagram illustrating the configuration of a memory system according to an embodiment of the present disclosure. Hereinbelow, repetitive explanations will be omitted if deemed redundant.

Referring to FIG. 18, a memory system 1000' according to an embodiment may include a memory device 1200' and a controller 1100. The controller 1100 includes a RAM 1110, a CPU 120, a host interface 1130, an ECC circuit 1140, a memory interface 1150, and so on.

The memory device 1200' may be a nonvolatile memory. Furthermore, the memory device 1200' may have a structure described above with reference to FIGS. 1A and 16, and be manufactured by the manufacturing methods described above with reference to FIGS. 1A to 16. In an embodiment, the memory device 1200' may include a stack; channel layers including channel patterns passing through the stack, dummy channel patterns passing through the stack, and a coupling pattern which is disposed below the stack and couples the channel patterns with the dummy channel patterns; a bit line coupled with the channel patterns; and a well pick-up line coupled with the dummy channel patterns. The structure of the memory device 1200' and the manufacturing method thereof are the same as those described above; therefore, detailed explanation thereof will be omitted.

Furthermore, the memory device 1200' may be a multi-chip package including a plurality of memory chips. The plurality of memory chips are divided into a plurality of groups. The plurality of groups are configured to communicate with the controller 1100 through first to k-th channels CH1 to CHk. The memory chips of each group communicate with the controller 1100 through a common channel. For reference, the memory system 1000' may be modified such that each single memory chip is coupled to a corresponding single channel.

As described above, since the memory system 1000' according to an embodiment may include the memory device 1200' having improved integration and characteristics, the integration and characteristics of the memory system 1000' may also be improved. In particular, the memory device 1200' according to a present embodiment is formed of a multi-chip package, whereby the data storage capacity and the operating speed thereof can be enhanced.

Figure 19:
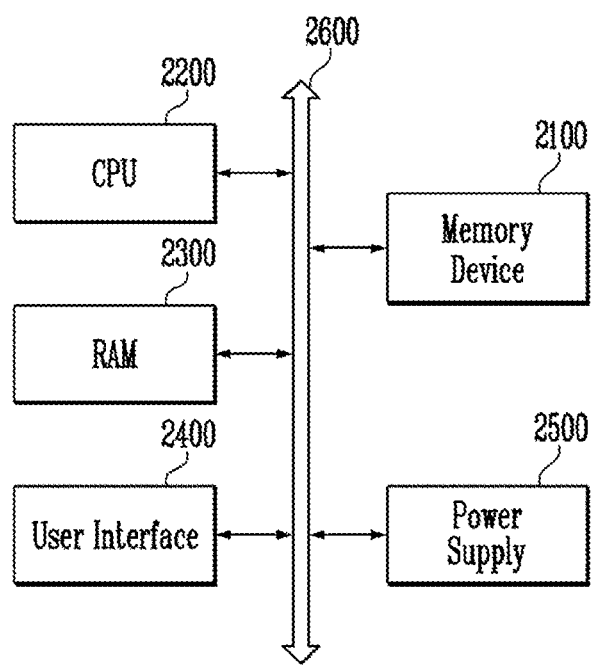
FIGS. 19 and 20 are block diagrams illustrating a computing system according to an embodiment of the present disclosure.

FIG. 19 is a block diagram illustrating the configuration of a computing system according to an embodiment of the present disclosure. Hereinbelow, repetitive explanations will be omitted if deemed redundant.

Referring to FIG. 19, the computing system 2000 according to an embodiment of the present disclosure includes a memory device 2100, a CPU 2200, a RAM 2300, a user interface 2400, a power supply 2500, a system bus 2600, and so forth.

The memory device 2100 stores data provided via the user interface 2400, data processed by the CPU 2200, etc. Furthermore, the memory deice 2100 is electrically coupled to the CPU 2200, the RAM 2300, the user interface 2400, the power supply 2500, etc. by the system bus 2600. For example, the memory device 2100 may be coupled to the system bus 2600 via a controller (not illustrated) or, alternatively, directly coupled to the system bus 2600. In the case where the memory device 2100 is directly coupled to the system bus 2600, the function of the controller may be performed by the CPU 2200, the RAM 2300, etc.

The memory device 2100 may be a nonvolatile memory.

Furthermore, the memory device 2100 may have a structure described above with reference to FIGS. 1A and 16, and be manufactured by the manufacturing methods described above with reference to FIGS. 1A to 16. In an embodiment, the memory device 2100 may include a stack; channel layers including channel patterns passing through the stack, dummy channel patterns passing through the stack, and a coupling pattern which is disposed below the stack and couples the channel patterns with the dummy channel patterns; a bit line coupled with the channel patterns; and a well pick-up line coupled with the dummy channel patterns. The structure of the memory device 2100 and the manufacturing method thereof are the same as those described above; therefore, explanations thereof will be omitted.

As described above with reference to FIG. 18, the memory device 2100 may be a multi-chip package configured with a plurality of memory chips.

The computing system 2000 having an above-mentioned configuration may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, or the like.

As described above, since the computing system 2000 according to an embodiment may include the memory device 2100 having improved integration and characteristics, the characteristics of the computing system 2000 may also be improved.

Figure 20:
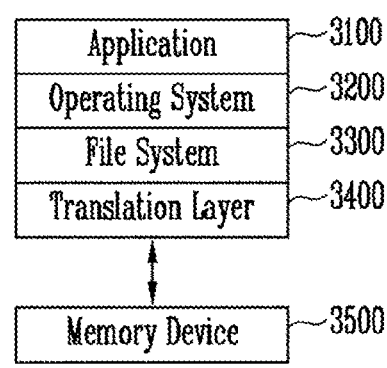

FIG. 20 is a block diagram illustrating a computing system according to an embodiment of the present disclosure.

Referring to FIG. 20, the computing system 3000 according to an embodiment of the present disclosure may include a software layer which has an operating system 3200, an application 3100, a file system 3300, a translation layer 3400, and so forth. Furthermore, the computing system 3000 includes a hardware layer such as a memory device 3500.

The operating system 3200 manages software resources and hardware resources, etc. of the computing system 3000 and may control program execution by the CPU. The application 3100 may be various application programs executed in the computing system 3000 and may be a utility executed by the operating system 3200.

The file system 3300 refers to a logical structure for controlling data, files, etc. which are present in the computing system 3000 and organizes files or data to be stored in the memory device 3500 or the like according to a given rule. The file system 3300 may be determined depending on the operating system 3200 used in the computing system 3000. For example, if the operating system 3200 is Microsoft's Windows system, the file system 3300 may be a file allocation table (FAT), an NT file system (NTFS), or the like. If the operating system 3200 is a Unix/Linux system, the file system 3300 may be an extended file system (EXT), a Unix file system (UFS), a journaling file system (JFS), or the like.

Although the operating system 3200, the application 3100 and the file system 3300 are expressed by separate blocks in the drawing, the application 3100 and the file system 3300 may be included in the operating system 3200.

The translation layer 3400 translates an address into a suitable form for the memory device 3500 in response to a request from the file system 3300. For example, the translation layer 3400 translates a logical address produced by the file system 3300 into a physical address of the memory device 3500. Mapping information of the logical address and the physical address may be stored in an address translation table. For example, the translation layer 3400 may be a flash translation layer (FTL), a universal flash storage link layer (ULL), or the like.

The memory device 3500 may be a nonvolatile memory. Furthermore, the memory device 3500 may have a structure described above with reference to FIGS. 1A and 16, and be manufactured by the manufacturing methods described above with reference to FIGS. 1A to 16. In an embodiment, the memory device 3500 may include a stack; channel layers including channel patterns passing through the stack, dummy channel patterns passing through the stack, and a coupling pattern which is disposed below the stack and couples the channel patterns with the dummy channel patterns; a bit line coupled with the channel patterns; and a well pick-up line coupled with the dummy channel patterns. The structure of the memory device 3500 and the manufacturing method thereof are the same as those described above; therefore, explanations thereof will be omitted.

The computing system 3000 having an above-mentioned configuration may be divided into an operating system layer implemented in an upper level region and a controller layer implemented in a lower level region. The application 3100, the operating system 3200, and the file system 3300 may be included in the operating system layer, and may be driven by an operating memory of the computing system 3000. The translation layer 3400 may be included in the operating system layer or the controller layer.

As described above, since the computing system 3000 according to an embodiment may include the memory device 3500 having improved integration and characteristics, the characteristics of the computing system 3000 may also be improved.

A semiconductor device having a stable structure and improved reliability may be provided. In manufacturing the semiconductor devices, the manufacturing process may be facilitated, and a procedure thereof may be simplified, and the manufacturing cost may be reduced.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor device comprising:
   a stack;
   channel layers each comprising channel patterns passing through the stack, dummy channel patterns passing through the stack, and a coupling pattern disposed below the stack and coupling the channel patterns with the dummy channel patterns;
   a bit line coupled with the channel patterns;
   a well pick-up line coupled with the dummy channel patterns; and
   an gap fill insulating layer comprising a base part disposed below the stack, first protrusions protruding from the base part and passing through the channel patterns, and second protrusions protruding from the base part and passing through the dummy channel patterns.

2. The semiconductor device according to claim 1, wherein the base part is formed within the coupling pattern.

3. The semiconductor device according to claim 1, further comprising:
   a source layer disposed below the coupling pattern; and
   a source pick-up line passing through the stack, and electrically coupling the channel layers with the source layer.

4. The semiconductor device according to claim 3, wherein the coupling pattern comes into direct contact with the source pick-up line and includes a junction formed in a region thereof coming into direct contact with the source pick-up line.

5. The semiconductor device according to claim 3, further comprising:
   a spacer disposed between the source pick-up line and the stack and configured to insulate the source pick-up line from the stack.

6. The semiconductor device according to claim 3, wherein the source layer comprises:
   a metal layer;
   a first polysilicon layer disposed on the metal layer, and including an N-type impurity at a first concentration; and
   a second polysilicon layer disposed on the first polysilicon, and including an N-type impurity at a second concentration less than the first concentration.

7. The semiconductor device according to claim 1, further comprising:
   first pads electrically coupling the channel patterns with the bit line, each of the first pads including a first type of impurity; and
   second pads electrically coupling the dummy channel patterns with the well pick-up line, each of the second pads including a second type of impurity different from the first type of impurity.

8. The semiconductor device according to claim 1, further comprising:
   supports interposed between the coupling patterns of the channel layers and supporting the stack.

9. The semiconductor device according to claim 1, further comprising:
   a source layer disposed below the coupling pattern and the supports.

10. The semiconductor device according to claim 8, wherein the supports are disposed between the channel patterns and have a line shape extending substantially parallel to each other in one direction.

11. The semiconductor device according to claim 8, wherein the supports are disposed between the channel patterns and have a pillar shape.

12. The semiconductor device according to claim 8, wherein each of the supports is disposed to partially overlap the corresponding adjacent channel patterns.

13. The semiconductor device according to claim 8, wherein the channel patterns are arranged in one direction and disposed with a first distance or a second distance therebetween, the second distance being greater than the first distance, and the supports are disposed between the channel patterns that are arranged with the second distance therebetween.

14. The semiconductor device according to claim 1, wherein each of the channel layers comprises separate patterns each coupling the corresponding dummy channel patterns with each other and pass through a portion of the stack.

15. The semiconductor device according to claim 14, wherein the separate patterns comprise semiconductor patterns coupling the dummy channel patterns with each other.

16. The semiconductor device according to claim 1, further comprising:

memory layers enclosing the respective channel layers.

\* \* \* \* \*